United States Patent

Domyo et al.

[11] Patent Number: 5,872,530
[45] Date of Patent: Feb. 16, 1999

[54] METHOD OF AND APPARATUS FOR COMPRESSING AND DECOMPRESSING DATA AND DATA PROCESSING APPARATUS AND NETWORK SYSTEM USING THE SAME

[75] Inventors: Seiichi Domyo, Fujisawa; Hiroshi Yoshiura, Kawasaki; Yoshiaki Hattori, Yokohama; Yutaka Otsu, Ebina; Hiromasa Murakami, Yokohama, all of Japan

[73] Assignee: Hitachi, Ltd., Tokyo, Japan

[21] Appl. No.: 790,063

[22] Filed: Jan. 28, 1997

[30] Foreign Application Priority Data

Jan. 31, 1996 [JP] Japan ................................ 8-015012

[51] Int. Cl.$^6$ ........................................... H03M 7/00
[52] U.S. Cl. .................................................. 341/106
[58] Field of Search ........................ 341/106, 51, 86, 341/65, 67, 107, 95

[56] References Cited

U.S. PATENT DOCUMENTS 5,467,087  11/1995  Chu ........................................... 341/51

FOREIGN PATENT DOCUMENTS 07064765A  8/1993  Japan .

Primary Examiner—Brian Young
Attorney, Agent, or Firm—Antonelli, Terry, Stout & Kraus, LLP

[57] ABSTRACT

In a data compression method using dictionaries, there are adopted a dynamic dictionary and a static dictionary to prevent the deterioration in the data compression ratio in the leading portion of the input data which cannot be efficiently compressed using the dynamic dictionary. Moreover, the configuration removes the disadvantage of the deterioration in the data compression ratio because character strings having a low appearance frequency occupy a large portion of the dictionary. Data to be compressed is inputted via an input unit to be decomposed into input bit strings 202. Using the input bit string as a retrieval key, a bit string retrieval is conducted through the static dictionary by a decision unit and a reference unit. According to a result from comparison between the input bit string and a bit string of the static dictionary and a result from the retrieval by a retrieving unit through the dynamic dictionary, whether or not the input bit string is to be registered to the dynamic dictionary is determined. For registration of the input bit string, an index is added thereto by a register unit before the registration. The input bit string or an index matching the string is outputted as compressed data.

44 Claims, 16 Drawing Sheets

FIG. 9

| RESERVED WORD | FREQUENCY PROBABILITY ≧2 | INDEX |
|---|---|---|
| if | 0.089 | 2 |
| else | 0.075 | 3 |
| swtich | 0.043 | 5 |
| case | 0.043 | 6 |
| while | 0.051 | 4 |
| for | 0.095 | 1 |
| do | 0.040 | 8 |
| goto | 0.012 | 11 |
| return | 0.038 | 9 |
| break | 0.042 | 7 |
| continue | 0.03 | 10 |
| ... | ... | ... |

901 = RESERVED WORD column, 902 = FREQUENCY PROBABILITY column, 903 = INDEX column, 900 = table

FIG. 10

ASTERISK (*) INDICATES ARBITRARY SENTENCE

1001 STATIC DICTIONARY 1000 1002

| EXPRESSION | INDEX |
|---|---|
| if(*) | 101 |
| if(*)<br>  *EXECUTION UNIT 1<br>else<br>  *EXECUTION UNIT 2<br>... | 102 |
| ... | ... |

COMPRESSED DATA EXAMPLE

⟨101⟩
⟨CONTROL CODE⟩
SENTENCE CODE
REPLACEMENT
⟨CONTROL CODE⟩

⟨102⟩
⟨CONTROL CODE⟩
SENTENCE CODE
REPLACEMENT
⟨CONTROL CODE⟩
REPLACEMENT OF
EXECUTION UNIT 1
⟨CONTROL CODE⟩
REPLACEMENT OF
EXECUTION UNIT 2

1003

METHOD OF AND APPARATUS FOR COMPRESSING AND DECOMPRESSING DATA AND DATA PROCESSING APPARATUS AND NETWORK SYSTEM USING THE SAME

BACKGROUND OF THE INVENTION

The present invention relates to a method of and an apparatus for compressing and decompressing data and a data processing apparatus and a network system using the same in which data including a character string or the like is converted into a bit string including a number of data bits, the number of data bits being smaller than that of the original data.

The data compression technology is used, for example, to reduce the ratio of data occupying a storage facility such as a hard disk and the amount of data to be transferred in data communication, thereby improving utilization efficiency of the storage device and communication path. The representative data compression methods of the prior art include LZ78 and an improved variation thereof described in pages 221 to 247 of the "Data Compression Handbook" published from Toppan in 1994.

The LZ78 and its variation include the following basic steps to compress data according to a predetermined rule.
(1) Character strings appearing in input data are stored in the form of a set of character strings in a storage. The set is called a dynamic dictionary.
(2) When a character string already stored in the dynamic dictionary appears again in the input data, an index (a positive integer in general) of the character string is generated as output data in place of the character string in the dynamic dictionary.
(3) When the dynamic dictionary is full of character strings thus accumulated therein, the registration of character strings is stopped or registered character strings are deleted. In the deleting operation, all character strings are deleted or the character strings are appropriately deleted beginning at the oldest character string.

According to the method of the prior art, since a character string including a plurality of characters and/or letters can be replaced with an index, the data volume is minimized through the data compression. Additionally, the compressed data can be easily decompressed by achieving the above processing steps in the reverse direction according to the rule.

However, the conventional data compression method using the dynamic dictionary is attended with the following problems.
(1) A character string first appearing in the input data has not been registered to the dynamic dictionary. Therefore, the character string cannot be substituted for an index and hence is directly outputted to the dictionary. Namely, the compression ratio is conspicuously decreased in the leading or first portion of the input data.
(2) Since character strings of the input data are sequentially registered to the dynamic dictionary, there may possibly take place a dictionary overflow. To cope with the difficulty, the stored character strings are to be deleted, for example, as follows.
 (a) The registration of character strings to the dictionary is interrupted.
 (b) All character strings stored in the dictionary are entirely deleted and then the dictionary is initialized.
 (c) Older character strings are deleted from the dictionary to preserve less older character strings therein.

In either cases of the deleting procedures, the chance of either one of the character strings in the dynamic dictionary to match a character string in the input data cannot be necessarily increased. In general, the probability of a character string to match either one of the character strings in the dynamic dictionary is small and hence the compression ratio is decreased.

SUMMARY OF THE INVENTION

It is therefore an object of the present invention to provide a method of and an apparatus for compressing data capable of compressing data with a high compression ratio.

Another object of the present invention is to provide a method of and an apparatus for compressing data in which the compression ratio is not decreased in the first portion of the input data.

Still another object of the present invention is to provide a method of and an apparatus capable of preventing the decrease in the compression ratio caused by small character strings appearing with a high frequency and occupying a large area of the dictionary.

Further another object of the present invention is to provide a method of and an apparatus for decompressing the compressed data.

Another object of the present invention is to provide a method of and an apparatus for processing data including the data compressing and decompressing functions.

Another object of the present invention is to provide a network system including the data compressing and decompressing functions.

To achieve the above objects, there are provided configurations in accordance with the present invention as follows.

First, a dynamic dictionary and a static dictionary are utilized in combination in which the contents of the static dictionary are not changed. Registered to the static dictionary are relatively long character strings having a high appearance frequency and indices thereof. Compressed data includes the index data of the dynamic dictionary as well as the index of the static dictionary.

Specifically, there are outputted a code indicating either one of the input character string (to be referred to as an input bit string herebelow), index of the dynamic dictionary, index of the static dictionary and a code denoting the dynamic or static dictionary to be used in the decoding operation. In this process, the length of the codes of input bit string is stored. In the retrieval through the static dictionary, at least one of the lengths of codes of indices matching with the input bit string is stored. Similarly, in the retrieval through the dynamic dictionary, the code length of index matching with the input bit string is stored. The shortest one selected from the codes of input bit string and codes of the indices above is outputted as compressed data.

In addition, there may be employed a method in which when there is retrieved an objective bit string in the static dictionary, the index of the static dictionary is outputted.

Moreover, there may be adopted a dictionary switching method in which for a portion for which the data compression using indices of the dynamic dictionary cannot be carried out, namely, the first portion of the input data, for example, the leading 500 bytes thereof may be encoded using the codes of the input bit string or indices of the static dictionary.

Either one of these methods solve the problem (1) above.

Second, in order to remove the problem (2), there is employed either one of the following procedures including ① character strings having a low utilization frequency or degree are not registered to the dynamic dictionary and ② an overflow event from the dictionary is forecast to thereby delete character strings with a low usage degree from the dynamic dictionary.

In the procedure ①, specifically, the input bit string matching a data item in the static dictionary is not registered to the dynamic dictionary.

Furthermore, there may be utilized a procedure in which the index used in the registration of the input bit string to the dynamic dictionary is investigated in advance to encode the pertinent index into output data. When the index of the dynamic dictionary is resultantly smaller than that of the dynamic index, the registration thereof is carried out.

Additionally, at least one selected from attribute information of the static dictionary, appearance probability, and relationship between bit strings may be used as additional information so as to register the input bit string according to the additional information.

In the procedure ②, concretely, each bit string of the static dictionary is defined in connection with at least one of the additional information items including the attribute information, appearance probability, and relationship between bit strings such that at least one of the bit strings with a low usage degree is deleted from the dynamic dictionary according to the additional information.

Moreover, there may be employed a process in which either one of the upper-limit value of the size of dynamic dictionary and that of the number of registered bit strings and either one of the current value of the size of dynamic dictionary and that of the number of registered bit strings are stored. At an overflow event in which the current value exceeds the upper-limit value, the system refers to the additional information of the bit string in the static dictionary so as to delete the bit string from the dynamic dictionary according to the result of the referring operation.

The problem (2) is solved by either one of the processes above.

When the data compression method and apparatus are implemented according to the present invention, it is necessary to configure a static dictionary including bit strings having a high appearance frequency. In a favorable configuration of the present invention, the static dictionary includes at least either one selected from a group including at least one unitary word of natural languages such as English and Japanese or a portion thereof, at least one reserved word of the program language or a portion thereof, and at least one instruction word of the machine language or a portion thereof. Particularly, the contents of the static dictionary includes character strings of natural languages or character strings as nominal expression of natural languages. Adding attribute information to the character strings, there are defined the part of speech, inflection of word forms, meaning of words, expressions, and the like.

In a case in which the data compression method and apparatus of the present invention are implemented, careful consideration is to be given to the table configurations of the static and dynamic dictionaries and the selection of programs handling the respective dictionaries. In a particularly favorable structure of the data compression apparatus, there are included a dynamic dictionary including a maximum of $2^{10}$ to $2^{15}$ (1K to 32K) indices and a static dictionary including a maximum of $2^{12}$ to $2^{17}$ (4K to 128K) indices. In addition, there is provided an initialization screen to select a program to generate the static dictionary, a program to resister input bit strings to the dynamic dictionary, and a program to delete registered bit strings from the dynamic dictionary so as to set data compression conditions for the static and dynamic dictionaries.

Furthermore, when implementing the data compression method and apparatus of the present invention, it is necessary to share the static dictionary between the compression source and destination. In accordance with the present invention, the data compression is conducted in a file transfer operation via a network. The data compression can be accomplished in the following configuration. When the apparatus of the decode destination can be identified, there is adopted a procedure in which prior to the use of the static dictionary, the shared use of static dictionary is confirmed. Alternatively, there may be provided a general index for the static dictionary. In this situation, the compression source compresses the data to be encoded into the general purpose index in accordance with an index unique to the compressor and then transfers the compressed data to the decode destination. The data is then converted in accordance with the general index into an index unique to the decoder.

As above, according to the data compression method of the present invention, the data compression ratio can be increased when compared with the data compression method using only the dynamic dictionary.

BRIEF DESCRIPTION OF THE DRAWINGS

These and other objects and advantages of the present invention will become apparent by reference to the following description and accompanying drawings wherein:

FIG. 9 is a diagram showing an example of layout of the static dictionary including at least one character string of natural, program, and machine languages and additional information thereof;

FIG. 10 is a diagram showing an example of layout of the static dictionary including syntactic rules as the additional information;

DESCRIPTION OF THE PREFERRED EMBODIMENTS

Description will now be given of an example of embodying an operation (embodiment) in which an input bit string is compared with bit strings in a static dictionary to register the bit string to a dynamic dictionary according to a result of the comparison. In this connection, however, the present invention is not restricted by the embodiment.

Referring first to FIGS. 1, 2, 7, and 8, description will be given of an outline of the embodiment.

Figure 2:
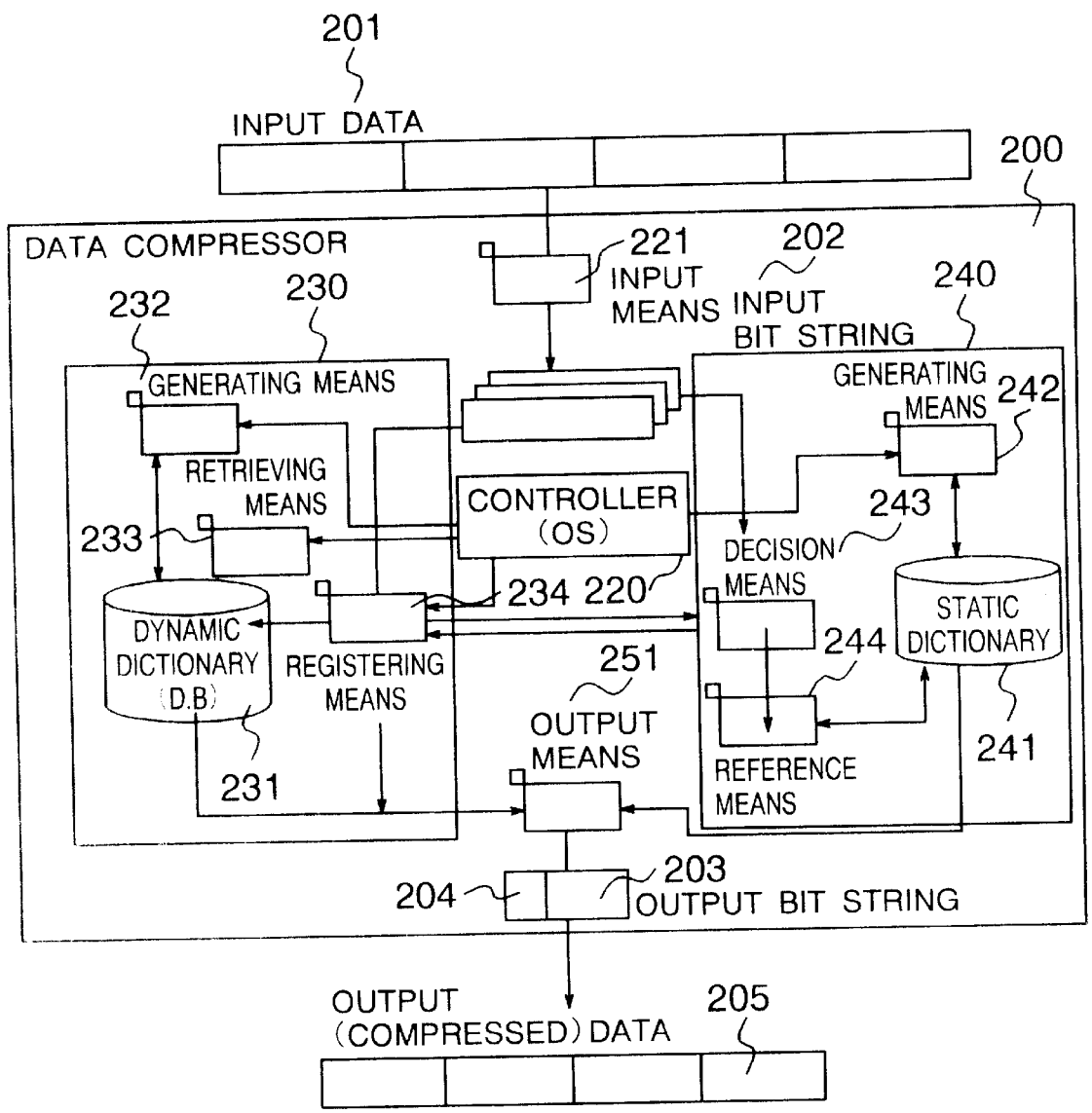
FIG. 2 is a diagram showing constitution of a data compressor employing a dynamic dictionary as well as a static dictionary.

FIG. 2 shows the construction of a data compressing apparatus employing the dynamic and static dictionaries. The data compressor 200 receives as an input thereto input data 201 to compress the data into compressed data 205 by reducing the data volume of the input data 201. The compressor 200 is implemented by a computer as a data processing apparatus, for example, a personal computer. Alternatively, the compressor 200 may be realized by a dedicated facility linked between a computer and a network. The compressor 200 includes a dynamic dictionary controller 230, a static dictionary controller 240, and a controller 220 for supervising the overall processes of the compressor 200. The overall controller 220 includes, for example, a central processing unit (CPU) of a computer operating under control of an operating system (OS). The controller 220 further supervises means 221 for inputting data to be compressed and means 251 for outputting therefrom compressed data.

The dynamic dictionary controller 230 includes a dynamic dictionary 231, generating means 232, retrieving means 233, and registering means 234. The dynamic dictionary 231 is a database for storing therein bit strings and indices and is constructed in a storage of a computer system, for example, in a hard disk system incorporated in a computer system. The generating means 232, retrieving means 233, and registering means 234 are implemented by programs which handle and process the dynamic dictionary 231.

These programs are stored on the hard disk of the computer system and are invoked by the computer system to be moved onto a main storage thereof. The programs are executed by the central processing unit to accomplish respective predetermined functions.

The static dictionary controller 240 includes a static dictionary 241, generating means 242, retrieving means 243, and registering means 244. The static dictionary 231 is a database in which bit strings and indices are to be stored. The database is formed in a storage of a computer, for example, in a hard disk system incorporated in a computer system. The generating means 232, retrieving means 233, and registering means 234 are realized by programs which manipulate and process the dynamic dictionary 241.

The programs above are stored on the hard disk of the computer system and are invoked by the computer system to be moved onto the main storage thereof. The programs are then executed by the central processing unit to develop predetermined functions.

The input means 221 and output means 251 include programs (device drivers) for respectively accomplishing data input and output operations with such an internal storage of the computer system as a hard disk unit, a remote file system via a network, and/or an external storage such as a floppy disk or a magnetic tape. The input means 221 receives and converts input data 201 into an input bit string 202 to be outputted therefrom. The output means 251 receives an output bit string 204 which is an index produced from the dynamic dictionary 231 or the static dictionary 241 and then adds a control code 203 to the received bit string 204 to thereby create compressed data 205 as output data.

Figure 1:
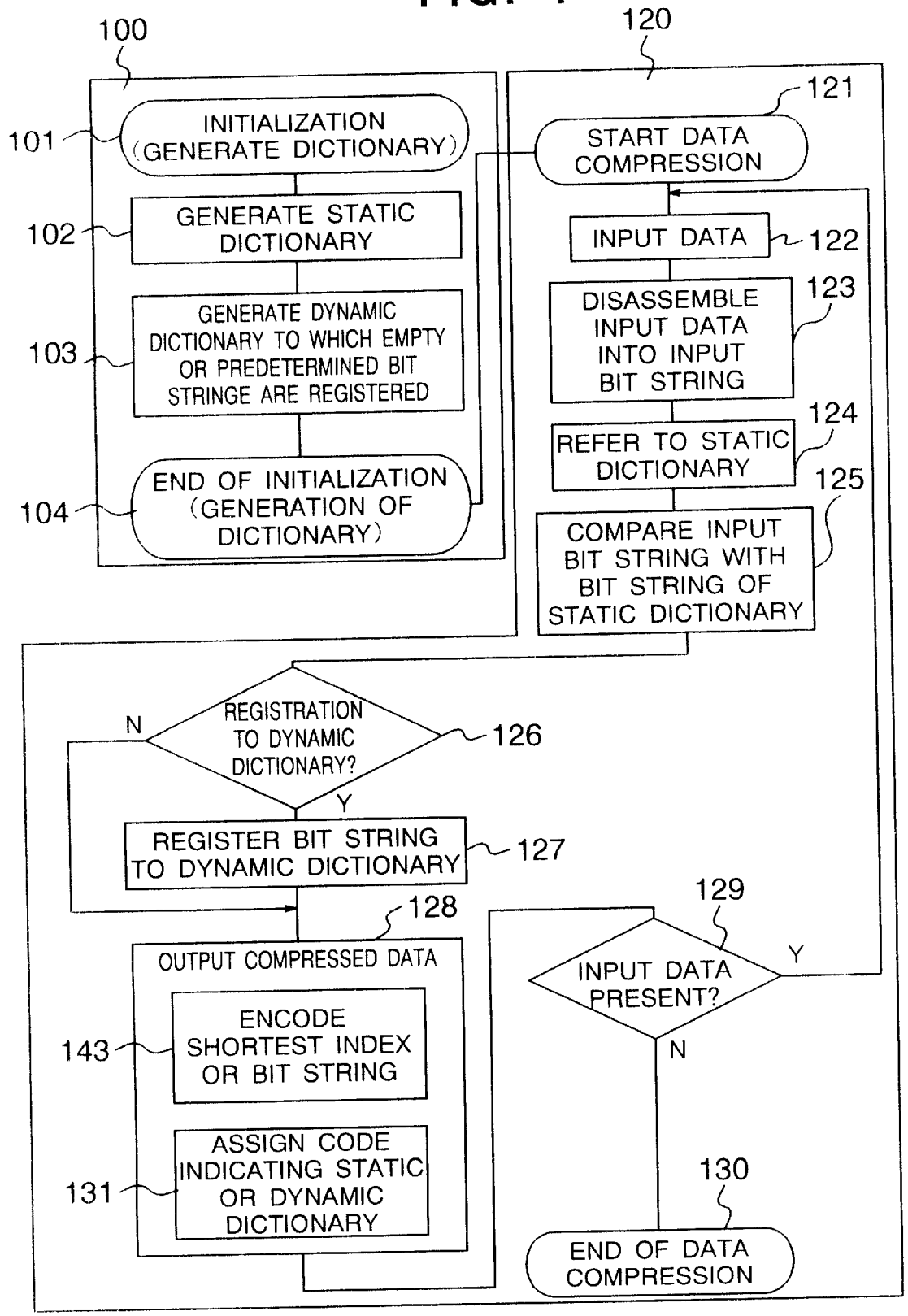
FIG. 1 is a flowchart showing a data compression procedure using a static dictionary in addition to a dynamic dictionary.

FIG. 1 is a flowchart of a procedure to compress data in the apparatus of FIG. 2 employing the dynamic and static dictionaries. The data compressing procedure of the embodiment includes an initializing process (step 100) of generating or compiling the static dictionary 241 and the dynamic dictionary 241 and a data compressing process (step 120).

Step 100 will be first described. When a manager of the system inputs a command specifying a file and data to be compressed, the compression process is commenced (step 101). First the static dictionary 241 is produced by generating means 242 (step 102). Specifically, bit strings and indices are defined, for example, according to character strings of a dictionary and an electronic dictionary of a word processor. Subsequently, the dynamic dictionary 231 is initialized by generating means 232, namely, empty or predetermined bit strings are registered to the dynamic dictionary 231 (step 103). In the initialization of the dynamic dictionary 231, empty bit strings may be registered thereto or there may be registered fundamental bit strings including predetermined bit strings such as alphabetical and other codes of the ASCII code system and alphabetical codes, katakana (a type of Japanese syllabary), and hiragana (another type of Japanese syllabary) of the JIS code system. Either one of these initialization processes is available depending on the utilization mode, the storage capacity of the computer used, and/or the structure of a hash table for index retrieval. When the steps above are finished, the initialization process is completed (step 104).

In this embodiment, the static dictionary 241 is created prior to the dynamic dictionary 231, which however does not restrict the present invention. That is, the dynamic dictionary 231 may be generated before the static dictionary 241. Additionally, although the predetermined bit strings includes alphabetical and other codes of the ASCII code system and alphabetical codes, katakana (a type of Japanese syllabary), and hiragana (another type of Japanese syllabary) of the JIS code system in the embodiment, the present invention is not restricted by the embodiment. Namely, there may be adopted any code system in which each character is uniquely defined according to a predetermined rule.

Subsequently, step 120 will be described. When the creation of the static dictionary 241 is confirmed, the data compression process is started (step 121). First, data to be compressed is inputted to the system (step 122). For example, when the system is implemented using UNIX, there are inputted a file having a specified name or data in the standard input mode. The input data 201 is disassembled or decomposed by input means 221 into input bit strings 202 according to a predetermined block unit (e.g., 64 bits per block; step 123). Next, using each input bit string 202 as a retrieval key, a search operation is made through the static dictionary 241 by decision means 243 and reference means 244, which is to be initiated after the decision means 243 (step 124). Thereafter, the input bit string 202 is compared with a bit string obtained from the static dictionary 241 (step 125).

Using the result of comparison and that obtained from the bit string retrieval by the retrieving means 233 through the dynamic dictionary 231, it is determined whether or not the input bit string 202 is to be registered to the dynamic dictionary 231 (step 126). When this is the case, the input bit string 202 is registered thereto together with an index by registering means 234 (step 127). Otherwise, there is not achieved any particular operation. Finally, the input bit string 202 or the index matching the string 202 is outputted as compressed data 205 (step 128). When there exists another input data, control is returned to step 122; otherwise, the data compression process is terminated (step 129 and 130).

In this connection, although when the data compression process 120 is terminated in step 130, the static dictionary 241 is initialized for the next input data by the initialization process 100 in the embodiment above, the present invention is not restricted by the embodiment. That is, the static dictionary 241 may be generated in a quasi-fixed fashion so that it is unnecessary to initialize the static dictionary 241 for the subsequent input data after the data compression process 120 is terminated. This procedure leads to an advantageous effect of minimization of the processing time.

Figure 7:
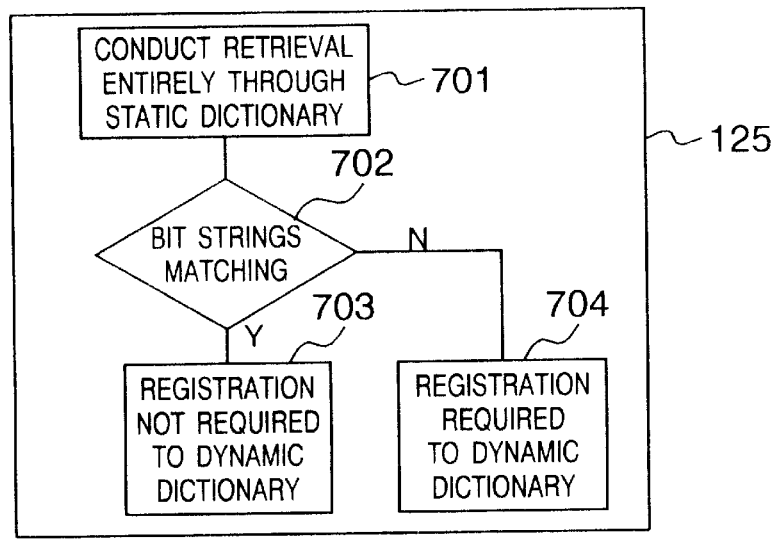
FIG. 7 is a flowchart for explaining a procedure in which a bit string matching the static dictionary is not registered to the dynamic dictionary.
Figure 8:
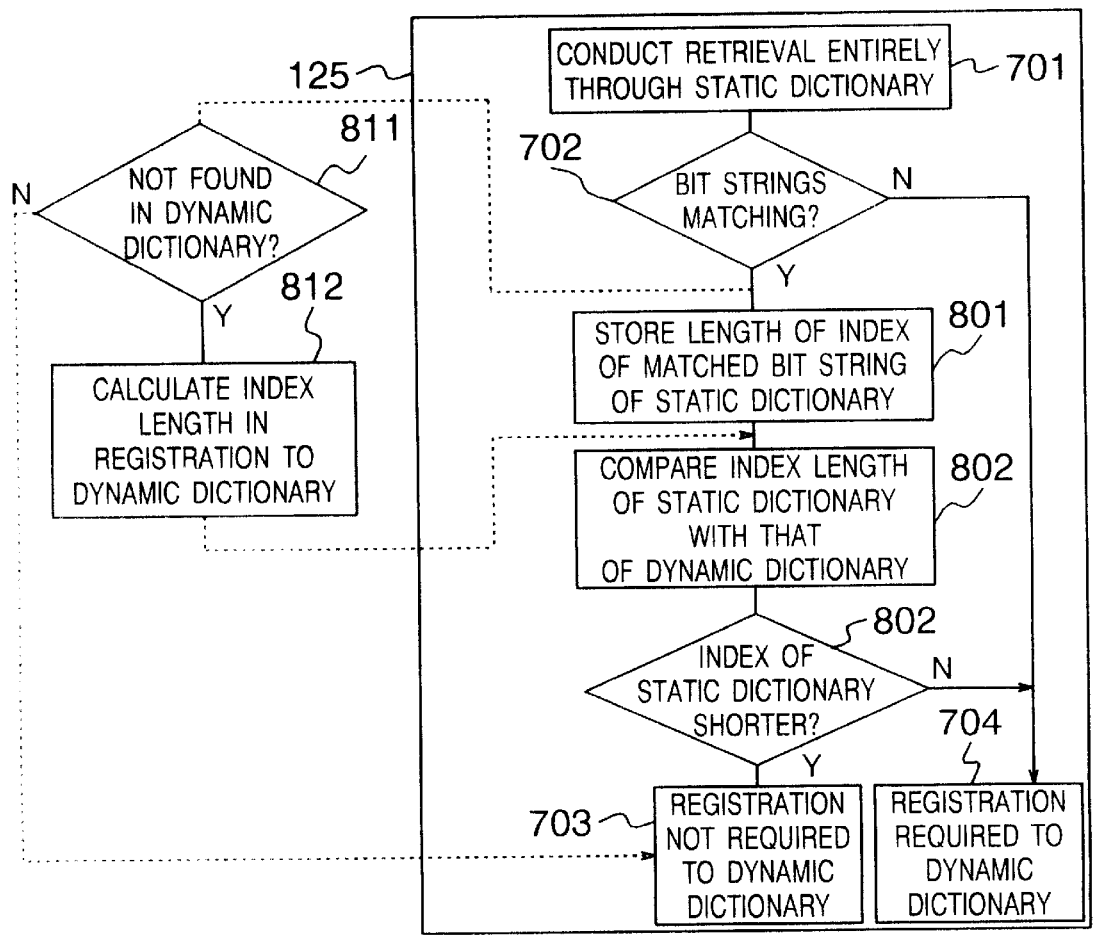
FIG. 8 is a flowchart showing a procedure in which the indices respectively of the static and dynamic dictionaries are calculated and the bit string is registered to the dynamic dictionary when the index of the dynamic dictionary is shorter than that of the static dictionary.

Referring now to FIGS. 7 and 8, description will be given in detail of two embodiments of the processing step 125 to compare the input bit string with a bit string in the static dictionary.

In the flowchart of FIG. 7, when the input bit string matches the bit string in the static dictionary 241, the input bit string is not registered to the dynamic dictionary 231. Designating the input bit string as a retrieval key, a bit string retrieving operation is accomplished through the static dictionary 241 (step 701) to thereby decide whether or not the input bit string matches a bit string in the static dictionary 241 (step 702). When a matching condition results, the input bit string is not registered to the dynamic dictionary 231 (step 703). Otherwise, the input bit string is registered thereto (step 704). According to the embodiment, it is advantageously possible to reduce the number of bit strings register to the dynamic dictionary 231.

In the flowchart of FIG. 8, when the input bit string matches a bit string in the static dictionary 241, the system calculates the lengths respectively of the indices thereof in the static and dynamic dictionaries 241 and 231. When the index of the dynamic dictionary 231 is smaller, the input bit string is registered to the dynamic dictionary 231. Steps 701 to 704 of FIG. 8 are the same as those of FIG. 7. Specifying the input bit string as a search key, a bit string search is carried out through the static dictionary 241 (step 701) to determine whether or not the input bit string matches a bit string in the static dictionary 241 (step 702). When the process results in a matching state, there is extracted an index of the pertinent bit string matching the input bit string and then memorizes the length of the index (step 801). Utilizing the input bit string as a retrieval key, a bit string search is carried out through the dynamic dictionary 231 to decide whether or not the input bit string matches a bit string in the dynamic dictionary 231 (step 811). When the process results in a mismatching condition, the system assumes that the input bit string is registered to the dynamic dictionary 231 to thereby forecast an index to be assigned to the input bit string and then memorizes the length of the index (step 812). When there exists a bit string matching the input bit string, the registration thereof to the dynamic dictionary 241 is not carried out (step 703). When "matching" results in step 702 and "missing" is decided in step 811, the index memorized in step 801 is compared with that memorized in step 812 (step 802). When the index of the static dictionary 241 is smaller (step 803), the input bit string is not registered to the dynamic dictionary 231 (step 703). Otherwise (step 803), the input bit string is registered to the dynamic dictionary 231 (step 704). When "mismatching" results in step 702, the input bit string is registered to the dynamic dictionary 231 (step 704).

In the embodiment, according to the results from the relationship between the lengths of indices obtained for the input bit string respectively in relation to the static and dynamic dictionaries, when a higher compression ratio will be expected if the dynamic dictionary is used at occurrence of the pertinent bit bit string, the input bit string is registered to the dynamic dictionary. Therefore, according to the embodiment, the compression process is achieved in preference of a higher compression ratio using the dynamic and static dictionaries, thereby achieving the data compression process with a higher compression ratio.

Referring now to FIGS. 3, 4, 5, 6, and 18, description will be given in detail of an embodiment of the process step 128 in which the dynamic and static dictionaries are used to produce as compressed data the index of either one of the dynamic and static dictionaries 231 and 241.

Figure 3:
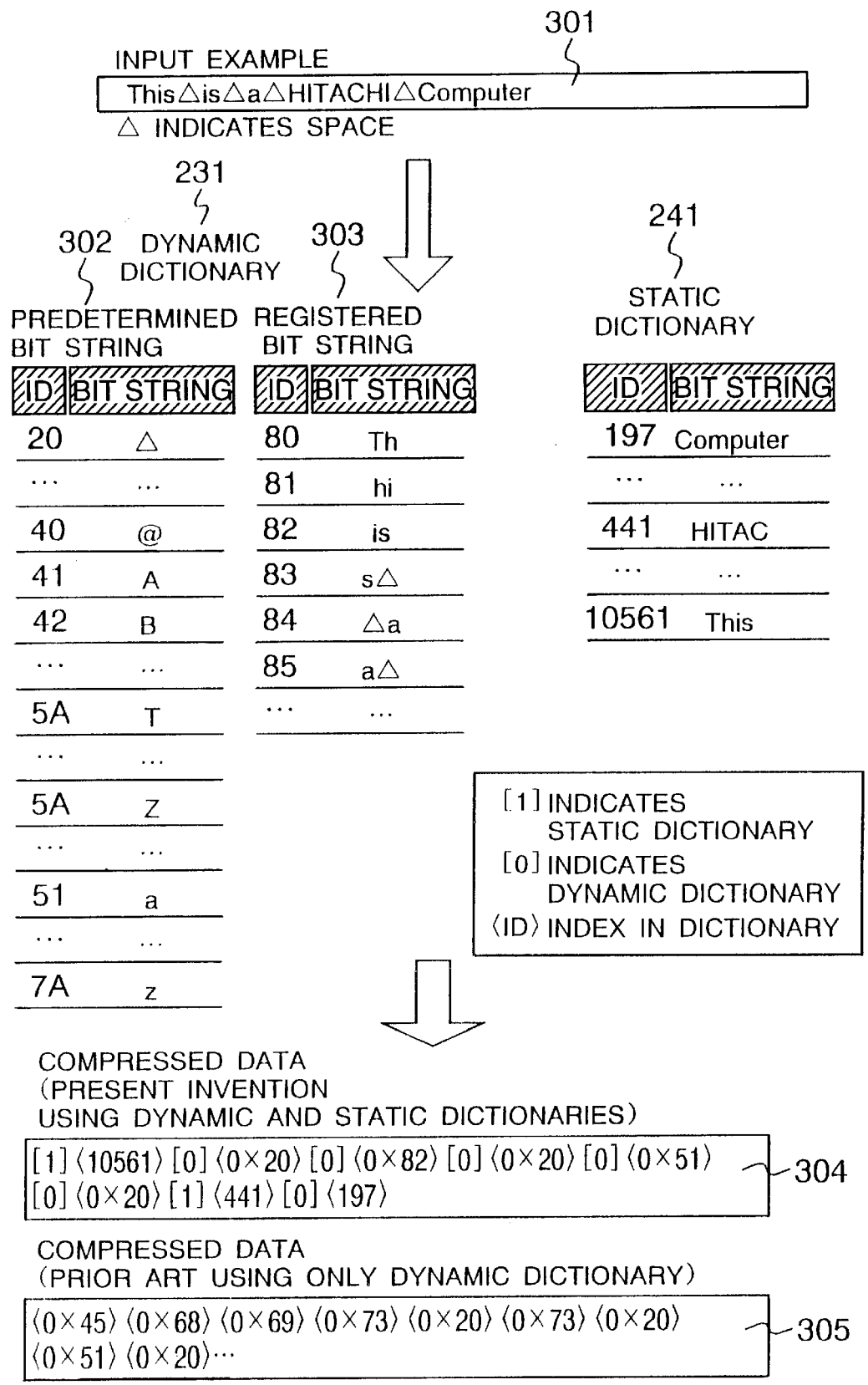
FIG. 3 is a diagram for explaining a procedure to select an index having a shorter bit length using a dynamic dictionary and a static dictionary.

FIG. 3 schematically shows an operation to select an index having a smaller bit length using the dynamic and static dictionaries. When compared with the conventional method employing only the dynamic dictionary, although the structure of compressed data is complicated, the compression ratio is improved.

In FIG. 3, input bit strings obtained by decomposing an ordinary sentence 301 match character strings defined in the static dictionary. In general, character strings having a relatively large bit length (e.g., English words each including ten or more alphabetical letters) are registered to the static dictionary. Moreover, an index having a length less than that of the pertinent character string is registered thereto so as to improve the compression ratio.

An example of output data of the embodiment is compression data 304. The data 304 is a string including an index of the dictionary or bit string itself 204, a code identifying that the item is an index of the dictionary or bit string itself, and a control code 203 including a code to identify that the item is related to the dynamic dictionary 231 or the static dictionary 241. The code system is complicated as compared with that of the compressed data 305 attained by the conventional compression process using only the dynamic dictionary. However, thanks to the smaller index size of the static dictionary, the compressed data 304 is generally less in size than the compressed data 305.

Figure 4:
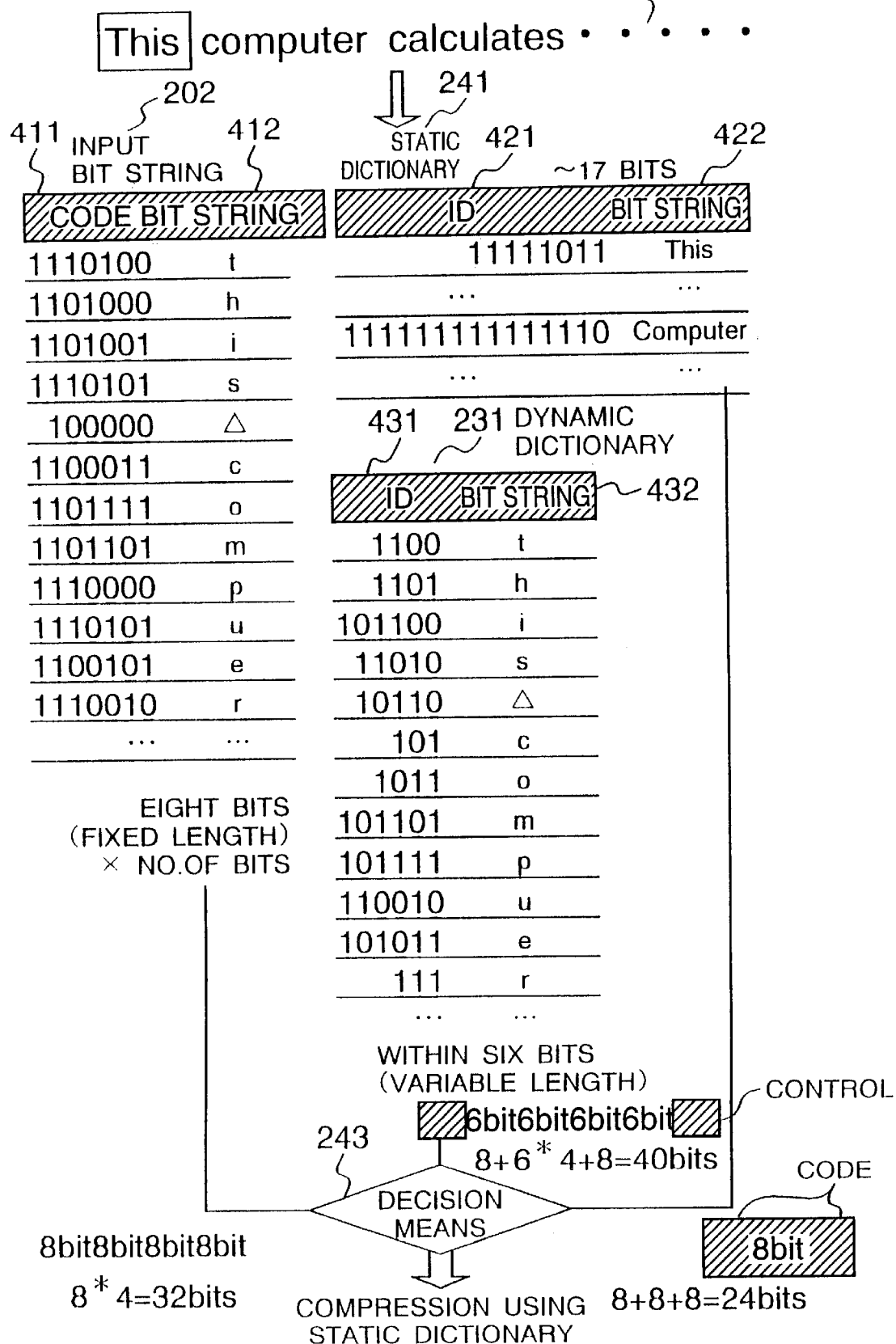
FIG. 4 is a diagram for explaining a process in which the shortest one selected from the input bit string and indices respectively of the dynamic and static dictionaries is outputted as compressed data.
Figure 18:
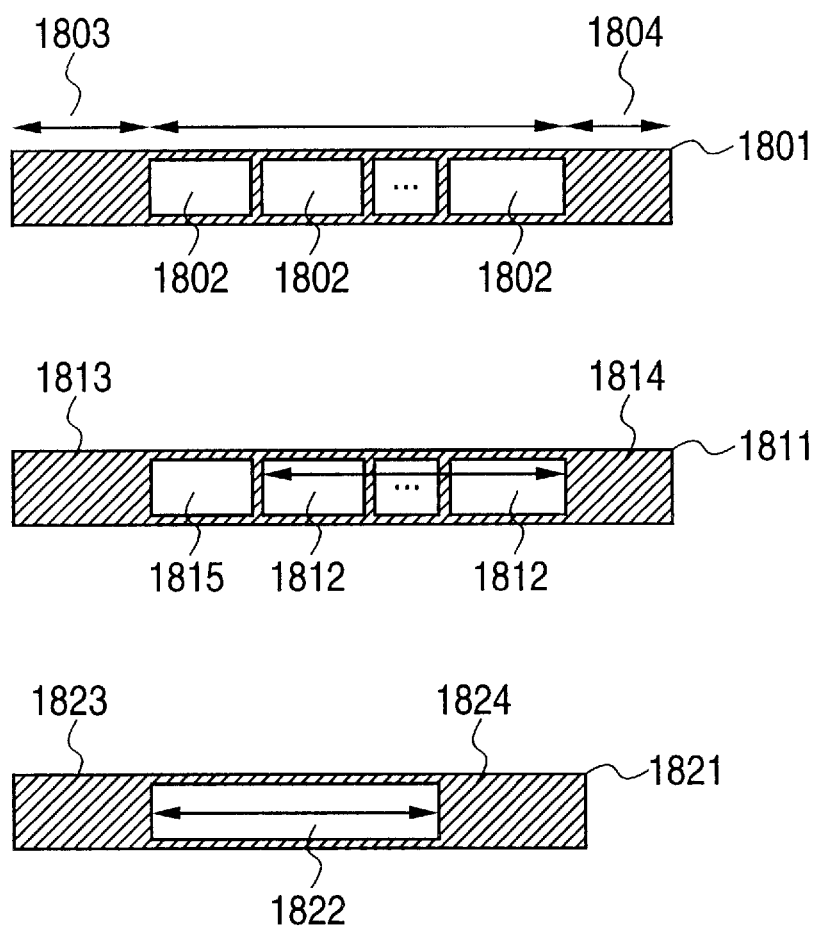
FIG. 18 is a diagram showing a relationship between the layout of compressed data and the respective indices according to the present invention.

Referring next to FIGS. 4 and 18, description will be given of a method of implementing the procedure to produce the index having the smaller length.

FIG. 18 is a diagram showing the layout of the compressed data and a relationship between the data and indices of the embodiment. Compressed data items 1801, 1811, and 1821 respectively correspond to a case in which the input bit string is directly encoded, a case in which an index of the dynamic dictionary is encoded, and an index of the static dictionary is encoded. In this embodiment, for simplification of explanation, it is assumed that the input data includes a sentence expressed in English and the data is inputted according to an 8-bit code system (ASCII code system). Control codes 1803, 1804, 1813, 1814, 1823, and 1824 indicate code types that the compression data is the code of the input character string, an index of the static dictionary, or an index of the dynamic dictionary. The control codes are such bit strings not used in the data as data of an escape sequence. In the data decoding operation, compressed data inputted to the system is decomposed into subdata items in a predetermined unit, e.g., in an 8-bit unit to thereby identify the control code such that the bit string is processed as the compressed data until a subsequent control code appears. The compressed data 1801 includes control codes 1803 and 1804 main data 1802 interposed between the control codes 1803 and 1804. The main data 1802 includes a code 411 having a fixed bit length. The length is eight bits in this case. The compressed data 1811 includes control codes 1813 and 1814 and main data 1812 enclosed between the control codes 1813 and 1814, the main data including a control code 1815 added thereto. The data 1812 includes a variable-length index in the dynamic dictionary 231. The control code 1815 is an 8-bit code denoting the length of the index constituting the data 1812. For example, since each index of the dynamic dictionary 231 includes a 6-bit code in the example of FIG. 4, an indication of 6-bit code system is set to the control code 1815. In this layout, the data 1822 is interposed between the control codes 1823 and 1824. The data 1822 includes an index in the static dictionary 241.

FIG. 4 is a diagram for explaining a process in which the length of the code of input bit string as well as the indices of the dynamic and static dictionaries related to the input bit string are calculated to resultantly decide an index having the smallest data length. In the embodiment, it is assumed that English words each having at least four letters are registered to the static dictionary. Namely, when compressing such English words in this configuration, it is advantageous to employ the static dictionary when compared with the operation in which each letter of the English word is encoded or the English word is converted into an index of the dynamic dictionary. The decision means 243 calculates the bit lengths respectively of the code of the input bit string and the indices of the dynamic and static dictionaries and then compare the lengths with each other to decide the smallest length. The input bit string 202 includes data of 8-bit code system, namely, an 8-bit code 411 and a bit string 412. The static dictionary 241 includes an index 421 having a maximum length of 17 bits and a bit string 422. The dynamic dictionary includes an index 431 having a maximum length of six bits and a bit string 432. The control code includes eight bits. For example, assuming that a word "This" as a constituent element of the sentence 401 is to be compressed, the system calculates the number of bits required to express the code 411 of the input bit string 202, index 431 of the dynamic dictionary 231, and index 421 of the static dictionary 241 in the respective notation. For the code 411 of the input bit string 202, since each code is of a fixed length, the code length is attained as 8 bits×4 (characters constituting the bit string). The control codes enclosing the item have a length of 8×2 bits. The total is calculated as 8×4+8×2=48 bits. For the index 431 of the dynamic dictionary 231, since the maximum length of index is six bits, the index length is attained as 6 bits×4 (characters). A code indicating the index length 6 is of eight bits and the control codes interposing the item are of a length of 8×2 bits. The total is therefore 6×4+8+8×2=48 bits (maximum). In this example, since the index corresponding to "This" is an 8-bit code "11111011", when the preceding and following control codes (8×2 bits) are added to the 8-bit code, there results 24 bits. In this situation, the system consequently selects by the decision means 243 the encoding process using the index 421 of the static dictionary 241. According to the example, the length of compressed data can be reduced to about a half of compressed data produced when the index 431 of the dynamic dictionary 231 or the code 411 of the input bit string 202 is selected.

In the description of the embodiment above, the length of indices of the dynamic and static dictionaries are calculated to thereby select either one of these dictionaries. Description will next be given of another embodiment preferentially using the static dictionary in which when the input bit string matches a bit string in the static dictionary, the index of the static dictionary is unconditionally outputted. Moreover, description will next be given of further another embodiment sing a dictionary switching process in which there is provided a threshold value of the distance between the first processing position and the first data position so as to achieve a change-over operation between the dictionaries in association with the threshold value.

Figure 5:
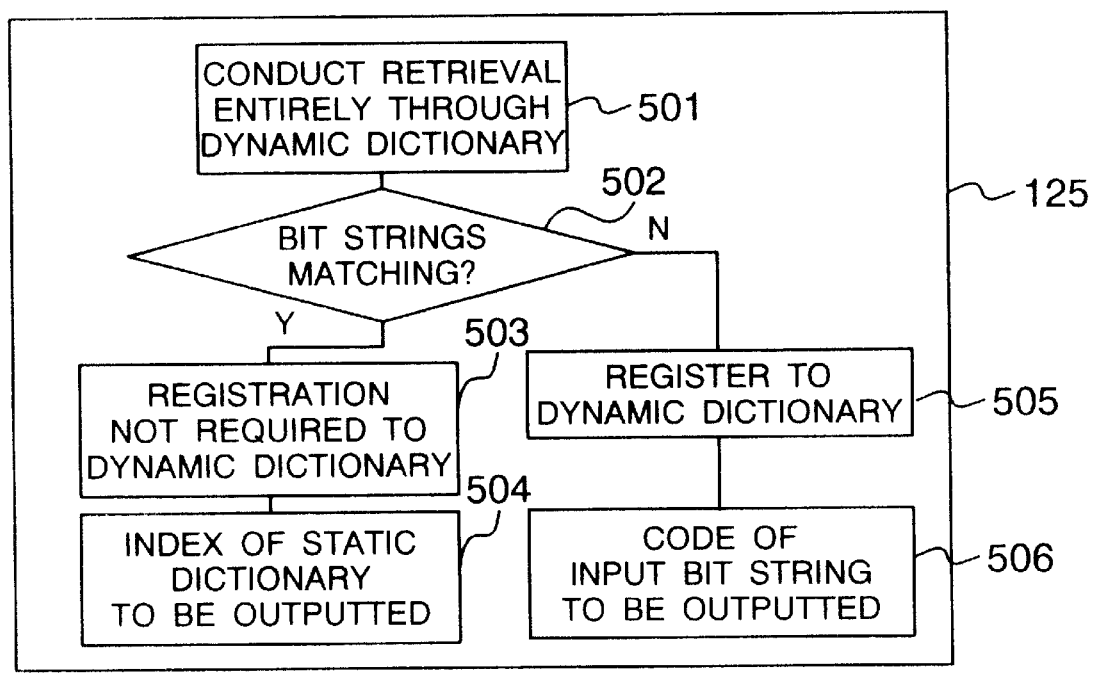
FIG. 5 is a flowchart showing a data compression method using preferentially the static dictionary.

FIG. 5 is a flowchart of a process to produce as compressed data the index of the static dictionary 241 matching the input bit string. This embodiment is an example in which the static dictionary is preferentially utilized, i.e., an embodiment of the process step 125 of FIG. 1 to compare the input bit string with a bit string of the static dictionary. First, a bit string retrieval is carried out through the overall static dictionary 241 (step 501). When a matching condition is detected (step 502) is assumed that the input bit string is not required to be registered to the dynamic dictionary 231 (step 503) and the index of the static dictionary 241 is to be outputted (step 504). When a mismatching state occurs for the bit string (step 502), it is assumed that the bit string is required to be registered to the dynamic dictionary (step 505) and the code of the input bit string is to be outputted (step 506).

Figure 6:
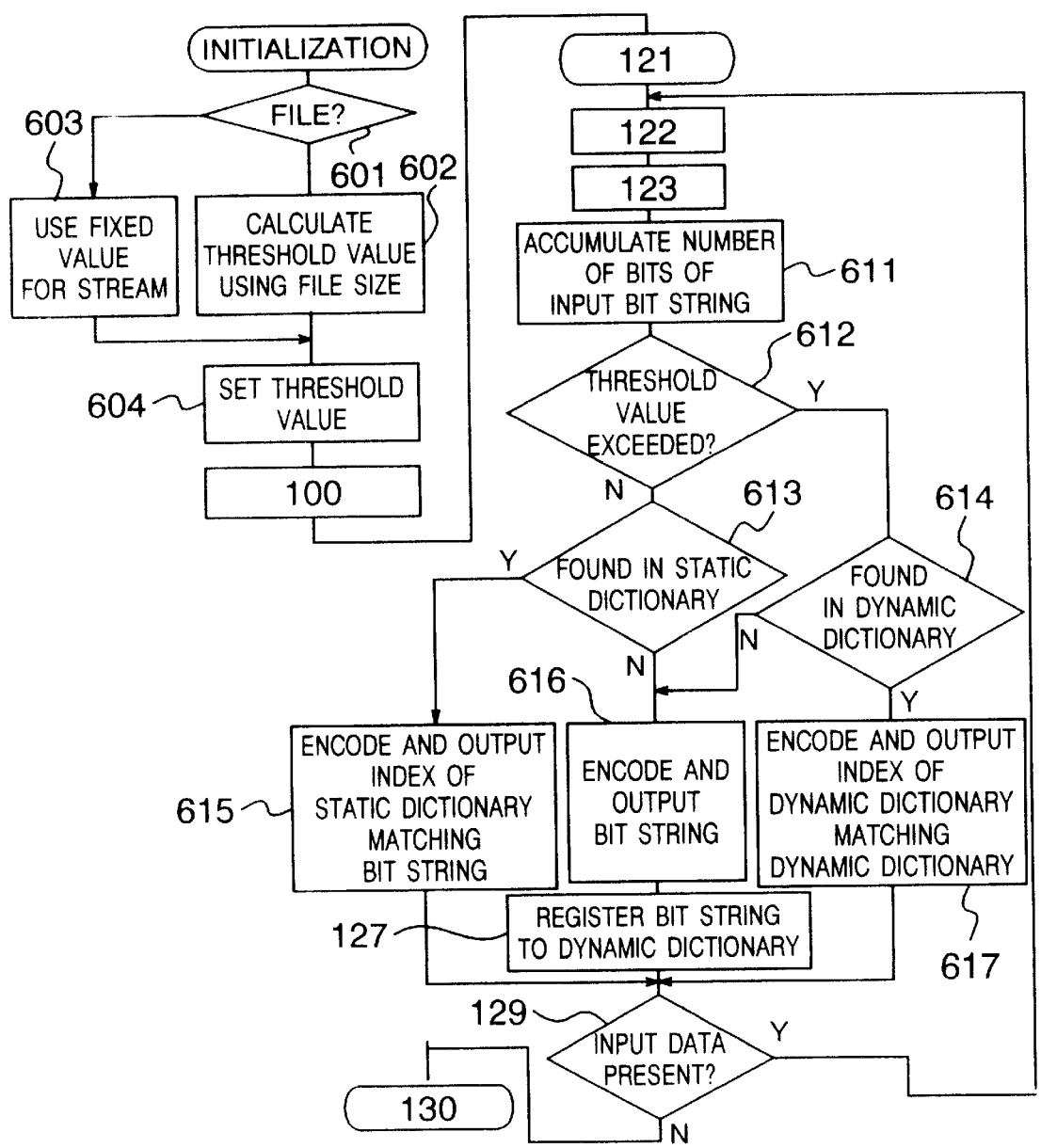
FIG. 6 is a flowchart showing a data compression method using a dictionary switching operation.

FIG. 6 is a flowchart of the procedure in which there is disposed a threshold value for the distance between the data processing position and the first data position such that the input bit string and static dictionary are used in a range from the first data position to the position related to the threshold value and the input bit string and the static and dynamic dictionaries are employed in a range beyond the position related to the threshold value. This embodiment is an example adopting the dictionary switching process and is another embodiment of the data compression process shown in FIGS. 1 and 4. This process is based on an empirical rules that for the leading part of the file, it is effective to use the static dictionary. Namely, the indices of the static dictionary are used when handling the preceding portion of the file ranging from the first position of the file to the position associated with the threshold value, whereas the indices of the dynamic dictionary are adopted when processing the file ranging from the position of the threshold value to the end of file. This embodiment is differs from that shown in steps 125 and 126 of FIG. 1 in which the static dictionary is employed up to the position of the predetermined threshold value without achieving the calculation of the index length.

The embodiment includes initial steps 601 to 604 of setting a threshold value before the initialization process 100 for the generation of dictionary and compression main process steps 611 to 617 substantially equivalent to process steps 601 to 604 of the internal process of the data compression process 120.

Description will be first given of the initial steps 601 to 604. In these steps, to decide a specific threshold value, it is determined that the input data is related to a file of which the size is known when the data is inputted or stream data such as communication data of which the terminal end is undetermined (step 601). When processing a file, the file size thereof is checked to calculate the threshold value according to the overall size or an irregular threshold value is selected depending on the value of file size (step 602). For example, assume the threshold value is set to a position corresponding to ten percent of the overall size. In this situation, if the ordinary size of the file is, for example, ten bytes, the threshold value is set to a position corresponding to one byte relative to the first position of the file. However, when the overall size is large, e.g., 100 bytes, the threshold value is irregularly set to a position corresponding to two to three bytes relative to the first position of the file, not to an ordinary position associated with ten bytes relative to the first position of the file. When processing stream data, a fixed initial value is adopted (step 603). When the threshold value is decided, the value is set to a register to be referred to in the data compression process (step 604).

Subsequently, the compression main steps 611 to 617 will be described. After the steps 121 to 123 of the data compression, the number of bits relative to the first position of the input bit string is decided (step 611) to be compared with the threshold value denoted in step 604 (step 612). When the threshold value is not exceeded, a bit string retrieval is conducted through the bit strings of the static dictionary to obtain a bit string matching the input bit string (step 613) and then an index thereof is encoded to produce output data (step 615). When a mismatching condition results in step 613, the code of the input bit string is encodes into output data (step 616) and the pertinent bit string is registered to the dynamic dictionary (step 127). When the threshold value is exceeded in step 612, a bit string retrieval is conducted through the bit strings of the dynamic dictionary to obtain a bit string matching the input bit string (step 614) and then an index thereof is encoded to create output data (step 617). When a mismatching condition results in step 614, control is passed to step 616 followed by step 127.

After the process above is finished, when there exists another input data (step 129), control is transferred again to step 122. When such input data is missing (step 129), the data compression process is terminated (step 130).

According to the embodiment, there are basically executed twice the process to insert a control code for the dictionary switching operation. That is, in the two control code inserting processes, the code indicating whether or not the threshold value is exceeded and the code designating whether or not the pertinent dictionary includes a bit string matching the input bit string are employed. Therefore, the process is simplified to advantageously minimize the processing time. Additionally, in comparison with the case in which the dictionary switching takes place frequently, the number of control codes is reduced, leading to an advantage that the data compression ratio is resultantly improved.

Referring now to FIGS. 9 and 10, description will be given of a method of implementing the data compressing apparatus and procedure in an optimal system. Specifically, description will be given of a configuration example of the static dictionary in which attribute information, appearance frequency, and/or a relationship between character strings are comprehensively recognized in consideration of an actual case in which the input data 201 is described in the natural, program, and/or machine languages, thereby improving the data compression ratio according to linguistic characteristics.

FIG. 9 schematically shows an embodiment of the static dictionary including one or more character strings in a program language and additional information thereof, and in particular, a static dictionary 900 including reserved words utilized in control statements of the C language and their additional information. According to an aspect of the embodiment, for a character string 901 registered to the static dictionary 900, there is provided as additional information a probability 902 indicating the probability of two more more appearances of the character string 901. For example, when it is known that the object of data compression is a source program written in the C language, the ratio of the outputs of indices from the static dictionary is increased by using a static dictionary as the dictionary 900, thereby expectedly improving the data compression ratio. The appearance frequency probability 902 need only be investigated by a plurality of source programs of the C language in advance. Namely, the obtained results can be employed as expected values regardless of the contents of input data. In a case in which a bit string is registered to or is deleted from the dynamic dictionary, the probability of matching between the input bit string and a bit string in the dynamic dictionary is considered to be increased when the appearance probability 90 is employed as the priority level in the registration or deletion of the bit string. This will further improve the data compression ratio. Furthermore, in this example, since the bit string having a higher value of appearance probability is assigned to an index 903 having a smaller bit length, it can be expected that the retrieval speed is also increased.

FIG. 10 shows an example of the layout of the static dictionary including linguistic rules as the additional information in which a static dictionary 1000 is configured by decompressing the static dictionary 900 to include the expression or use of words. For example, in the C language, the control statements can be syntactically described in several patterns. An expression 1001 establishing relationships between a plurality of reserved words is associated with an index 1002. In this example, since the index 1002 is indicated by a 3-digit integer, the code length of one set of expression including a plurality of reserved words is less than that in the case in which the index 903 is used. Moreover, a structure 1003 is specified for compressed data in association with the syntactical rules.

Incidentally, although the static dictionary includes character strings of a program language and their additional information in this embodiment, the present invention is not restricted by the embodiment. namely, the static dictionary may include one or more character strings in a natural, program, or machine language and additional information thereof.

Figure 11:
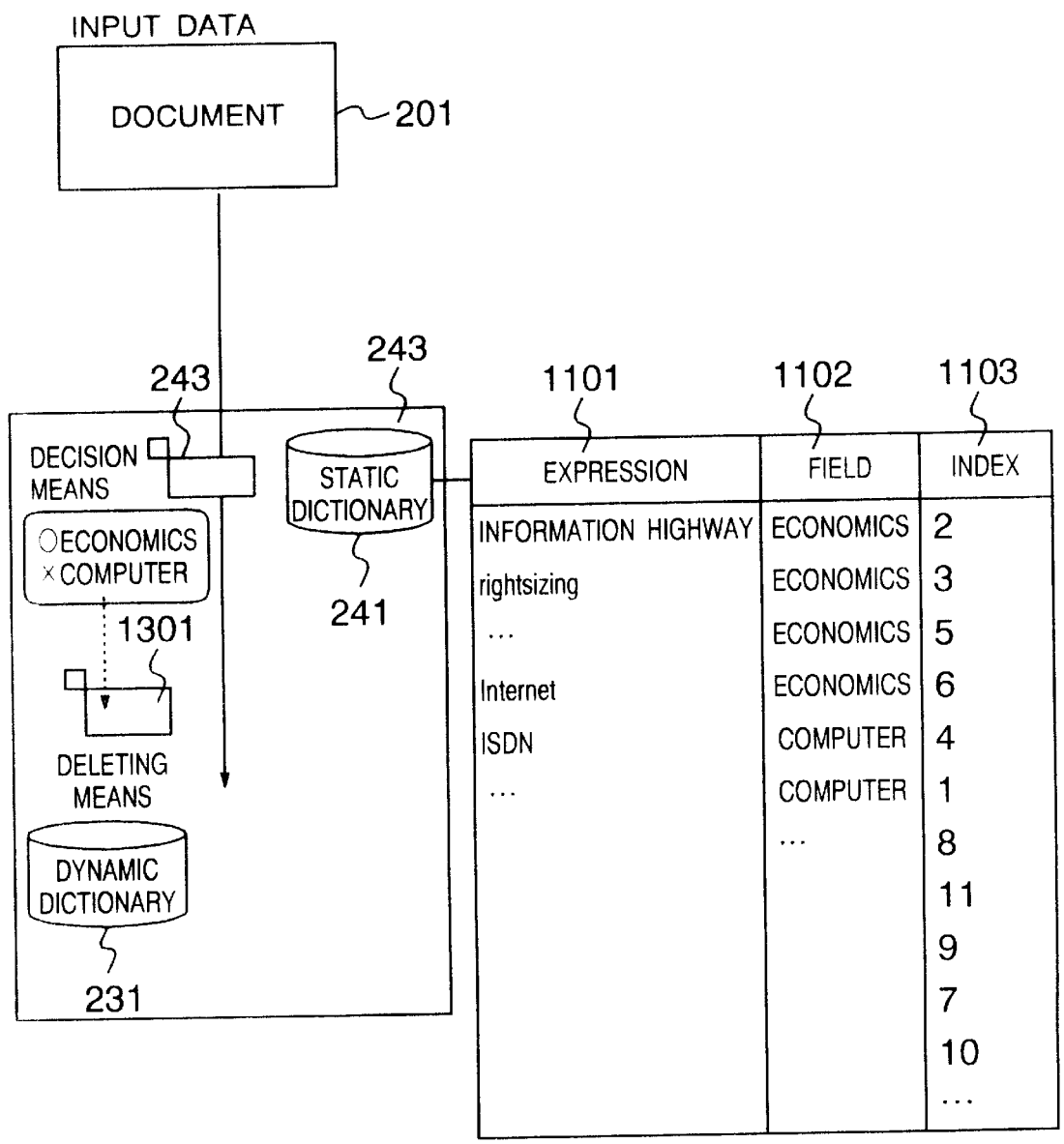
FIG. 11 is a diagram showing another layout example of the additional information.
Figure 12:
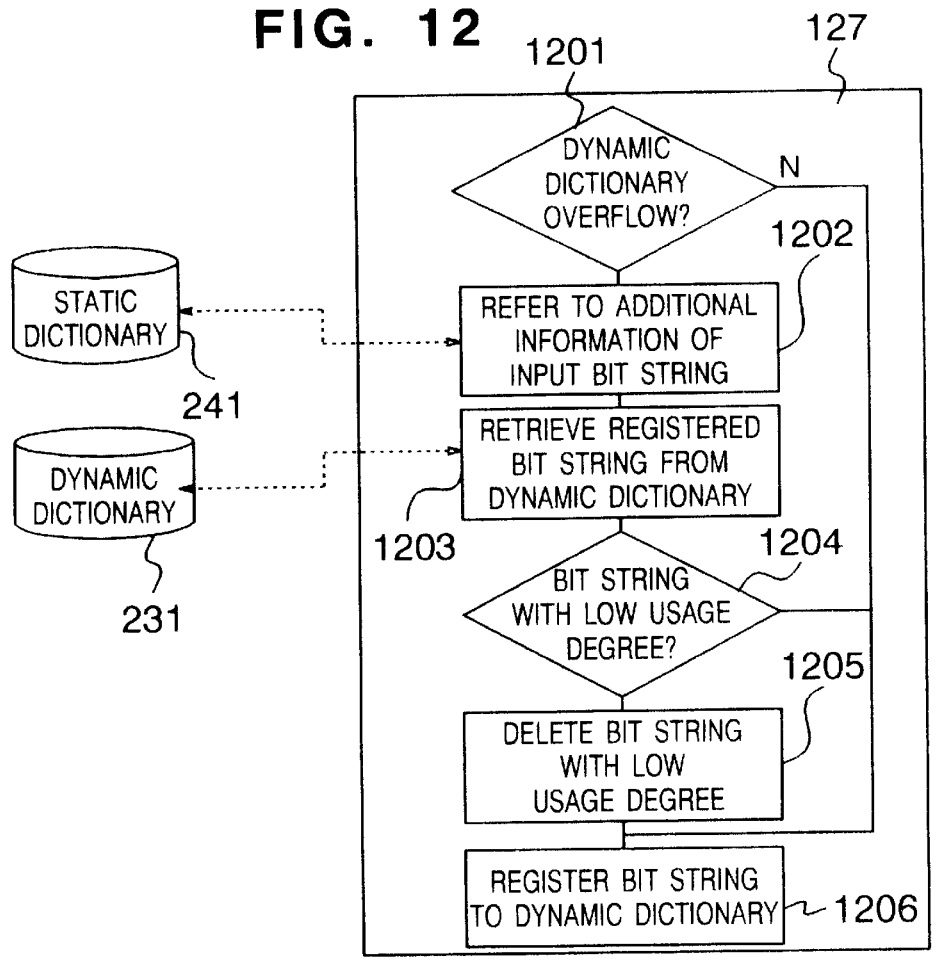
FIG. 12 is a flowchart showing a procedure in which bit strings having a low usage degree are deleted to reserve an area for registration of other bit strings.
Figure 13:
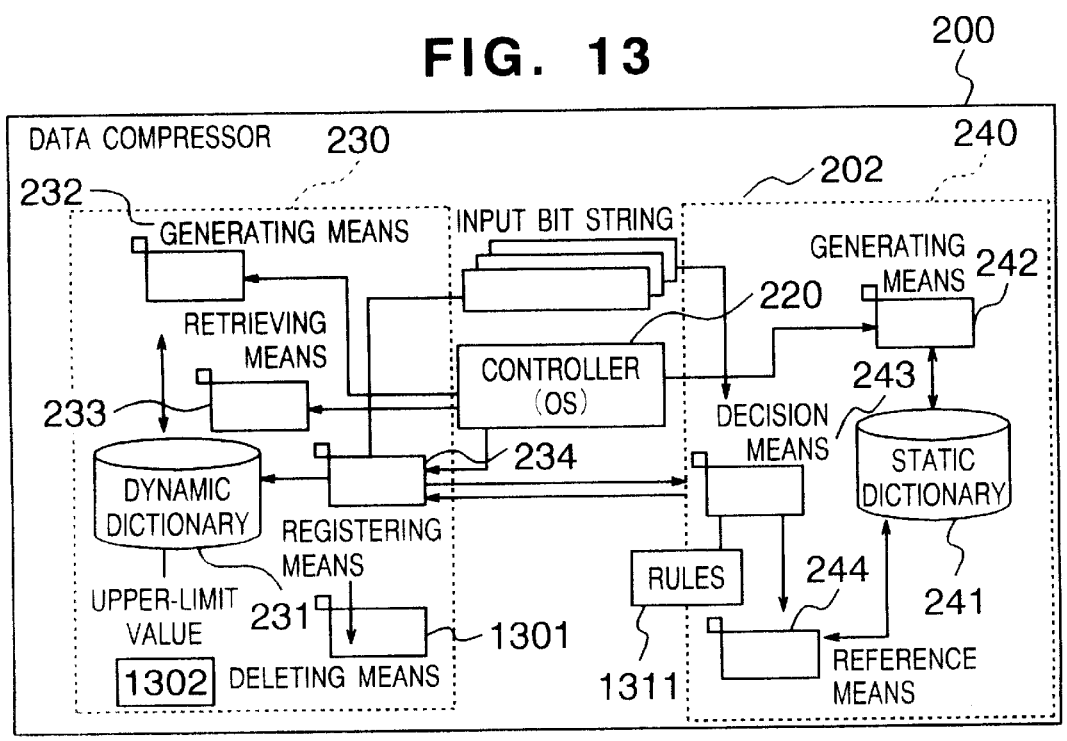
FIG. 13 is a diagram showing constitution to delete bit strings from the static dictionary according to additional information.

Referring next to FIGS. 11 to 13, description will be given of an embodiment in which the input bit string is compared with the bit string of the static dictionary described in conjunction with FIGS. 9 and 10. According to the result of comparison, the input string is not registered to or is deleted from the dynamic dictionary.

FIG. 11 is an embodiment the present invention adopting another additional information. The static dictionary 241 includes the bit strings 1101, additional information items 1102 identifying fields respectively corresponding to terms or words represented by the bit strings 1101, and indices 1103. In the processing of the input data 201, the contents thereof are analyzed by the decision means 243 to determine a field of document related to the input data. As a result, the registration of the input data 201 is skipped. Or, any bit string other than that related to the field is deleted by the deleting means 1301.

FIG. 13 is an example of the construction of the data compressing apparatus in which an upper-limit value 1302 of the registration of bit strings to the dynamic dictionary 231 is established and a rule 1311 is additionally disposed in the decision means 24 to delete bit string having a low utilization frequency according to additional information of the static dictionary 241. FIG. 13 differs from FIG. 2 in that there are arranged deleting means 1301 to be invoked when an overflow condition is detected by the registering means, a register 1302 to which an upper-limit value restricting the number of bit strings to be registered to the dynamic dictionary 231 is set, and a rule 1311 to decide the utilization frequency of the pertinent bit string according to the additional information of the static dictionary, i.e., whether or not the string deletion is to be achieved.

FIG. 12 is a flowchart showing an embodiment of the procedure to delete the bit string according to the additional information of appearance frequency of FIG. 9 in the data compressing system shown in FIG. 13. When an overflow condition is detected in the registration of an input bit string to the dynamic dictionary (step 127), bit strings having a low utilization frequency or degree are deleted therefrom to thereby reserve an area for the string registration. First, the number of input bits calculated is compared with the upper-limit value 1302. When an overflow occurs in the dynamic dictionary, the deleting means 1301 is initiated to pass control to step 1202. Otherwise, the input bit string is registered to the dynamic dictionary in the usual manner (step 1206). In the situation of the embodiment, to simplify the description, the deleting means 1301 selects as the deletion object any bit string having an appearance probability lower than that of the input bit string. First, the system refers to the appearance probability 902 provided as additional information of the input bit string (step 1202) to extract bit strings having a lower appearance probability. Thereafter, a bit retrieval is carried out through the bit strings in the dynamic dictionary 231 (step 1203). When there is detected a bit strings having a lower utilization frequency (step 1204), the system deletes the bit string from the dynamic dictionary (step 1205).

Figure 14:
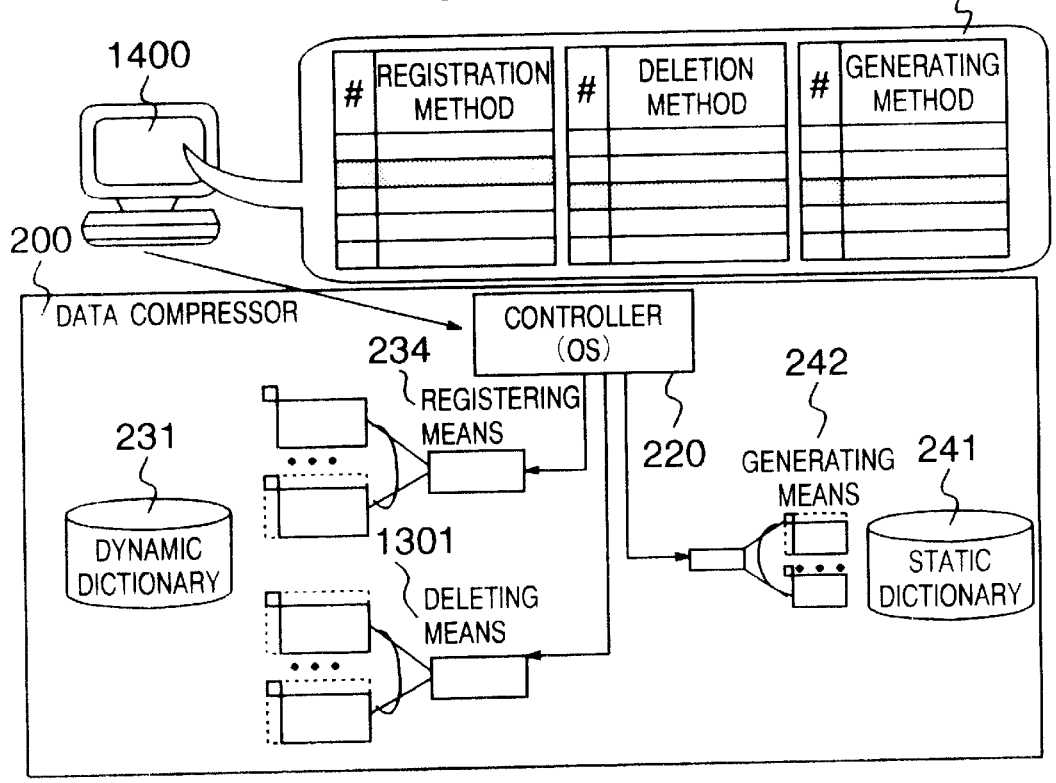
FIG. 14 is a diagram showing structure to initialize program types and compression conditions.

FIG. 14 shows constitution of an embodiment of the present invention for explaining an operation to initialize program types and compression conditions. According to an aspect of this embodiment, since the static dictionary is related to a plurality of generating means 242 and the dynamic dictionary is associated with a plurality of registering means 234 and a plurality of deleting means 1301, the user initializes the program types and compression conditions. The system further includes terminals 1400 connected to the data compressor 200. The terminal 1400 includes a screen 1401 to initialize the terminal 1400, for example, to select conditions from a table. The user of data compression selects from the setting screen 1400 the generating means 242, registering means 234, and/or deleting means 1301. In addition, the user sets, for example, the threshold value and reference values for the bit registration and deletion in the dynamic dictionary.

Figure 15:
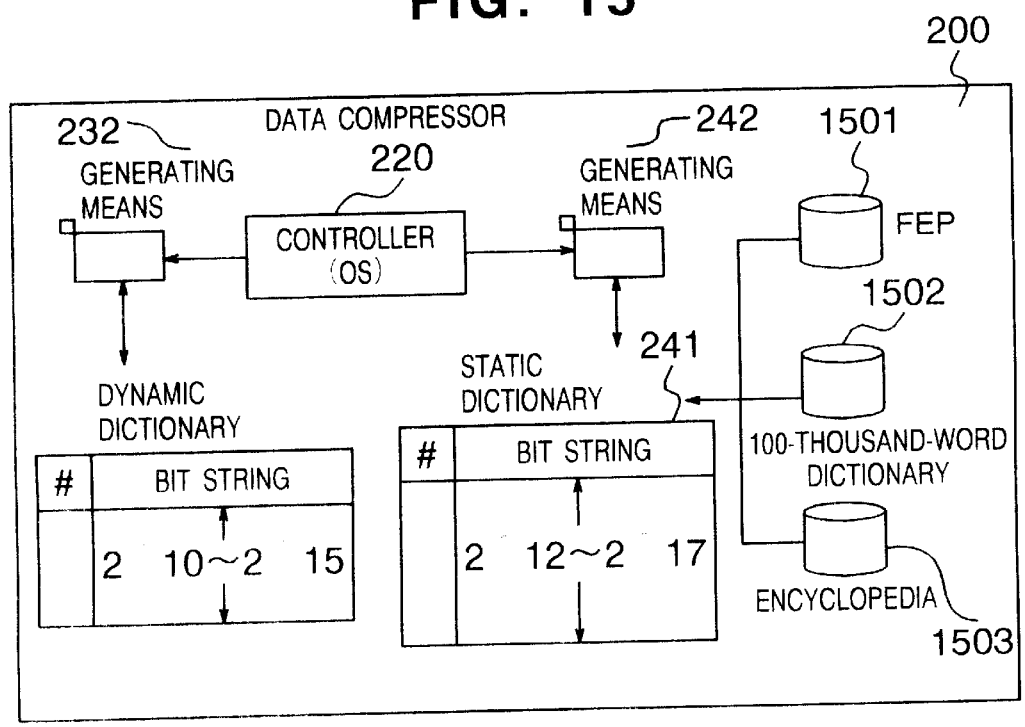
FIG. 15 is a diagram showing the construction of an embodiment of the static dictionary.

FIG. 15 shows structure of an embodiment of the static dictionary. In accordance with an aspect of the embodiment, there are provided mutually different ranges to which the dynamic and static dictionaries are respectively applied so as to advantageously utilize the dictionaries. Consequently, the maximum values of the indices respectively of the static and dynamic dictionaries are required to be under a condition as follows. In the static dictionary, there are registered a large number of character strings each having a relatively large bit string. Registered to the dynamic dictionary are character strings each having a short bit length and a high appearance frequency. Particularly, indices to be registered together with the character strings to the static dictionary are less in the bit length than those of the dynamic dictionary. As an embodiment of construction of the static dictionary, there will be generated a static dictionary 241 using at least one of the databases of a dictionary (Front End Processor) 1501 including about 20 thousand words of a word processor, an about 100-word English-Japanese dictionary and/or Chinese-character-Japanese dictionary giving the meanings of Chinese characters as they are read in Japanese, and/or an encyclopedia 1503 related to the respective specialized fields. For example, according to a predetermined criterion, the words commonly stored therein are extracted to thereby generate the static dictionary. On this occasion, it is optimal that the dynamic dictionary includes a maximum of $2^{10}$ to $2^{15}$ (1K to 32K) indices and the static dictionary includes a maximum of $2^{12}$ to $2^{17}$ (4K to 128K) indices.

Figure 16:
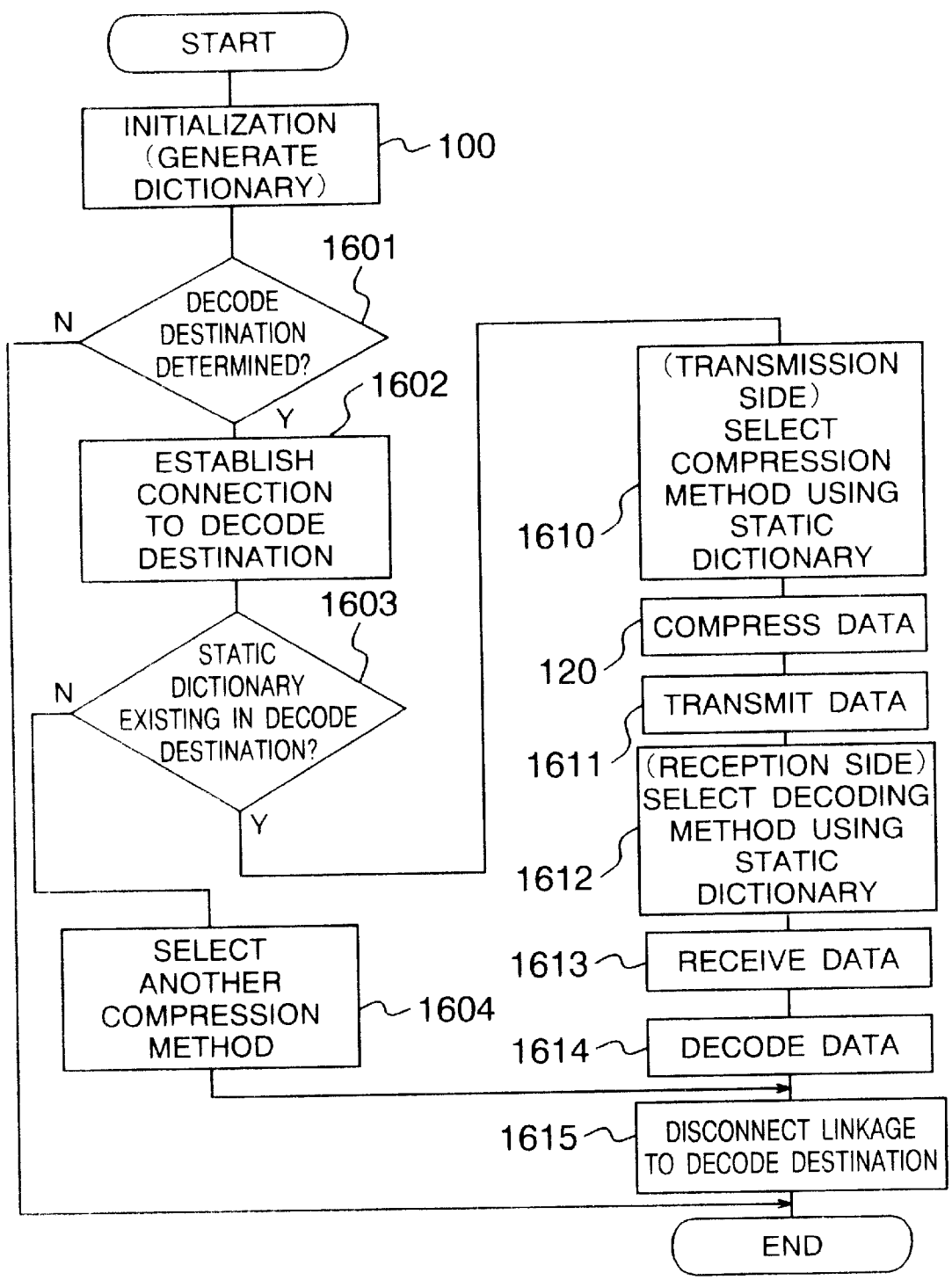
FIG. 16 is a flowchart showing a procedure to achieve the present invention when the static dictionary can be shared in a distributed system.

FIG. 16 is a flowchart of an embodiment of the present invention in which the static dictionary of the compression source and the decoding destination can be shared in a distributed system. This embodiment is different from that of FIG. 1 in that after the dictionary is initialized (step 100), there is conducted a process to issue an enquiry before the data compression 120 for existence or the same static dictionary in the decoding destination. Prior to the compression process, an apparatus connected via the network to the compression system is specified as the decoding destination. When this embodiment is applied to a file transfer process (FTP), there are used, for example, a host name and an IP address as arguments of a command to be executed. When the decoding destination is determined (step 1601), there is established a connection between the compression source and the decoding destination (step 1602). Otherwise (step 1601), the process is to be terminated. After the connection is established in step 1602, a file name of the static dictionary in the decoding destination is confirmed and then the version and the constituent elements of the static dictionary are examined. Based on results of the examining operation, it is decided whether or not the decoding destination and the compression source have the same static dictionary (step 1603). When this is the case, the system adopts a process using the dynamic dictionary 23 and the static dictionary 241 (step 1610). Otherwise, there is selected another process, for example, the conventional process to compress data using only the dynamic dictionary 231 or a process to transfer the static dictionary 241 from the compression source to the decoding destination (step 1604). The connection therebetween is then disconnected (step 1615). After step 1610 is conducted, the data is compressed by the compression source (step 120) to be sent to the decoding destination (step 1611). In the decoding destination, there is adopted a bidirectional data decoding method in relation to the compression process of step 1610 (step 1612). On receiving data (step 1613), the decoding source decodes the data (step 1614). When the process above is finished, the connection between the compression source and the decoding destination is disconnected (step 1615).

In this connection, although the steps 1610 to 1614 are sequentially executed in the embodiment, the present invention is not restricted by the embodiment. That is, the steps may be executed in a pipeline processing fashion. With the provision, the processing speed can be advantageously increased.

Figure 19:
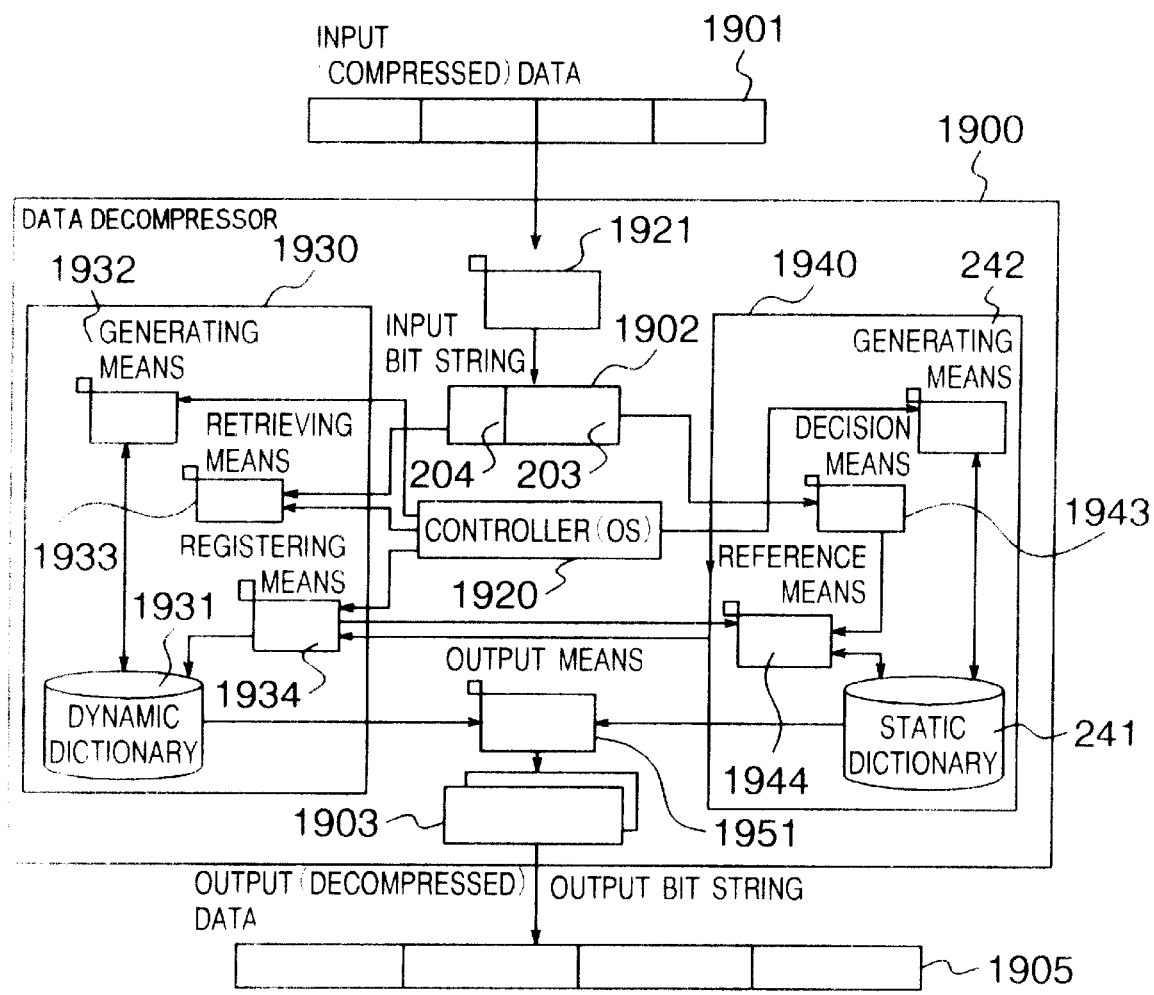
FIG. 19 is a diagram showing structure of a data decompressor using the dynamic and static dictionaries.
Figure 20:
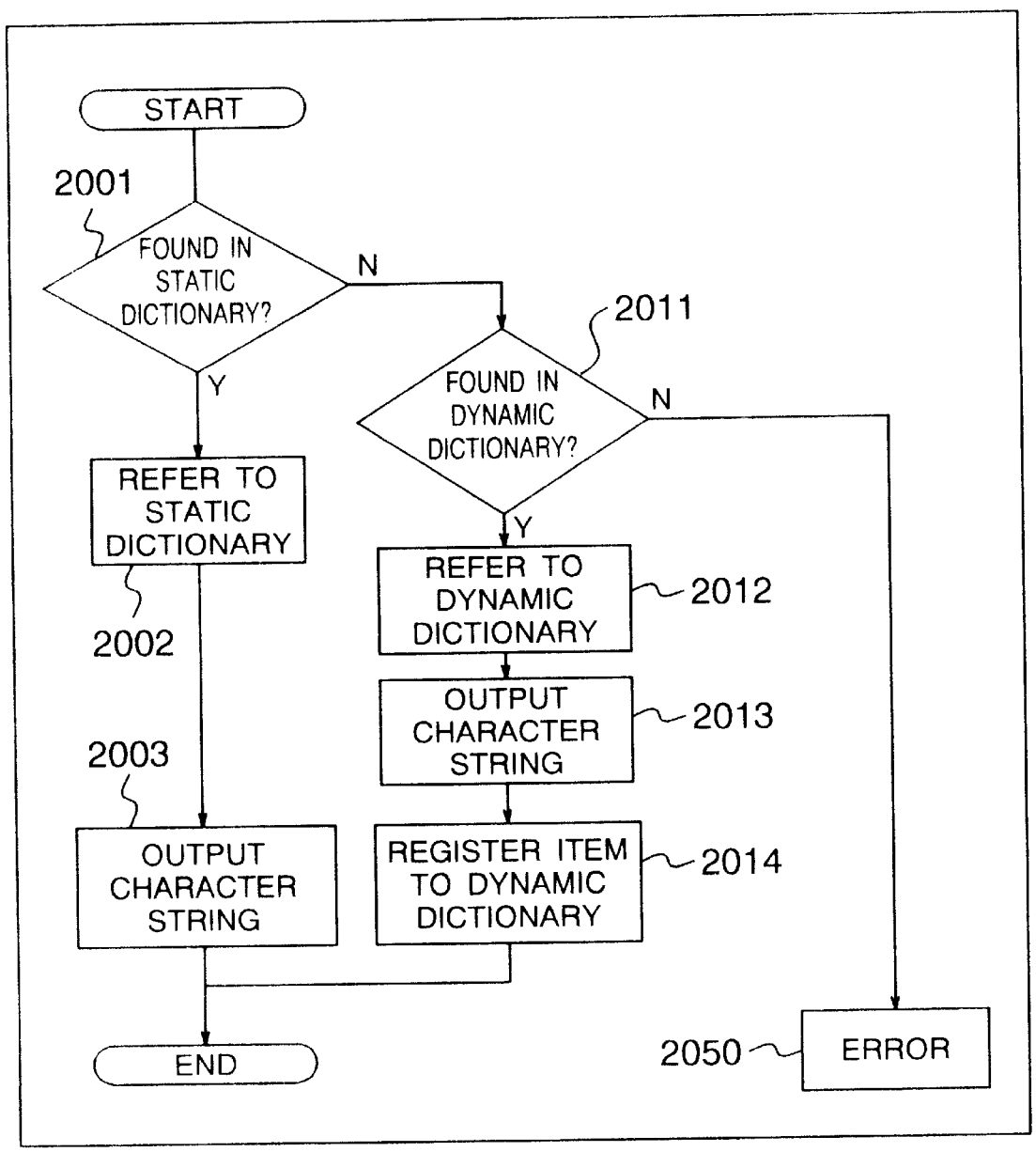
FIG. 20 is a flowchart showing a procedure in which data is decompressed by referring to indices of the static and dynamic dictionaries.

FIGS. 19 and 20 show an embodiment of an apparatus for and a procedure of decompressing the data 205 compressed according to the compressing apparatus and procedure described above.

FIG. 19 shows structure of the data decompressing apparatus employing the dynamic and static dictionaries. This embodiment is configured in association with the compressor 200 of FIG. 2. According to an aspect of the embodiment, static dictionary 241 and the generating means 242 of the compressor 200 are commonly used.

A data decompressing device 1900 receives the input data 205 to decompress the data into decompressed data of which the data volume is less than that of the input data 205. Like the data compressor 200, the data decompressor 1900 includes such a computer functioning as a data processing facility as a personal computer. Alternatively, the decompressor 1900 may be implemented by a dedicated apparatus connected between a computer and a network. The data decompressor 1900 includes a dynamic dictionary controller 1930, a static dictionary controller 1940, and a controller 1920 for supervising the overall processing of the system. The controller 1920 includes a central processing unit (CPU) of a computer operating under control of an operating system (OS). Moreover, the controller 1920 controls means 1921 for receiving input data to be decompressed and means 1951 for outputting decompressed data.

The dynamic dictionary controller 1930 includes a dynamic dictionary 1931, generating means 1932, retrieving means 1933, and registering means 1934. The dynamic dictionary 1931 includes a database for storing therein bit strings and indices thereof and is configured in a storage of a computer, for example, on a hard disk incorporated in the computer. The generating means 1932, retrieving means 1933, and registering means 1934 are implemented by programs handing the dynamic dictionary 1931.

These programs are stored on a hard disk in the computer and are moved into the main storage at initiation of the computer. The programs are thereafter executed by the central processing unit to achieve the predetermined functions.

The static dictionary controller 1940 includes a static dictionary 241, generating means 242, retrieving means 1943, and registering means 1944. The static dictionary 241 includes a database in which therein bit strings and indices thereof are stored. The dictionary 241 is constructed in a storage of a computer, for example, on a hard disk incorporated in the computer. The generating means 242, retrieving means 1943, and registering means 1944 are materialized by programs handing the static dictionary 1941.

These programs are stored on a hard disk of the computer and are moved into the main storage when the computer is activated. The programs are thereafter executed by the central processing unit to carry out the respective functions.

The input means 1921 and output means 1951 are realized by programs (device drivers) respectively accomplishing data input and output operations for such an integrated storage of the computer as a hard disk, a remote file system via a network, and/or an external storage such as a floppy disk or a magnetic tape. In this configuration, compressed data 205 is inputted to the system.

The input means 1921 receives the input data 205 and then converts the data into an input bit string 1902 to output the string 1902 therefrom. The output means 1951 receives an output bit string 1903 from the dynamic or static dictionary 1931 or 241 in association with the input bit string 1902 to output therefrom decompressed data 1905.

FIG. 20 is a flowchart of a procedure of the decompressor shown in FIG. 19 in which the compressed data is decompressed by referring to indices of the static and dynamic dictionaries 241 and 1931.

The decision means 1943 receives the input bit string 1902 and refers to the static dictionary 241 via the reference means 244. When the input bit string 1902 is present in the static dictionary 241 (step 2001), the system refers to the static dictionary 241 using the input bit string 1902 to attain an index thereof and a bit string associated therewith (step 2002), thereby outputting the bit string (step 2003).

In step 2001, when there is missing the pertinent index in the static dictionary 241, a search is made through the dynamic dictionary 1931 by the retrieving means 1933 (step 2011). When the bit string is found in the dynamic dictionary 1931, the system refers to the dynamic dictionary 1931 using the input bit string 1902 to attain an index thereof and a bit string associated therewith (step 2012) so as to output the bit string (step 2013). Additionally, the output bit string previously attained is combined with that obtained in the current process, for example, the first bit string including one byte of the previous output is combined with that of the current output to register the resultant bit string to the dynamic dictionary 1931 (step 2014).

In this regard, when the input character string 1902 is missing in the dynamic dictionary 1931 in step 2011, the input character string 1902 is regarded as erroneous and the process is terminated with a message of an error process (step 2050).

In the example above, the string retrieval is actually conducted through the static and dynamic dictionaries to decide whether or not the input bit string 1902 is found therein. The input bit string 1902 is configured in a data layout substantially equivalent to that of the output bit string 203 and index 204. Consequently, it is to be appreciated that the decision process can be achieved at a higher speed without conducting the dictionary retrieval when the utilization ranges of indices 204 are beforehand set respectively to the static dictionary (e.g., 0 to 1023) and the dynamic dictionary (e.g., 1024 and more).

A computer system or a data processing apparatus of a personal computer system generally includes the data compressor 200 and the data decompressor 1900 described above. The obtained data is stored, for example, via the data compressor 200 onto a hard disk incorporated in the apparatus. When utilizing the stored data, the compressed data is read from the hard disk to be decompressed by the data decompressed into the original data for the respective usage purposes. Incidentally, the static dictionary 241 may be shared between the data compressor and decompressor 200 and 1900 in this case. The dynamic dictionary may also be shared therebetween depending on situations. Moreover, when the data processing apparatus are connected to each other via a network to communicate data therebetween, data compressed by the data compressor 200 of the first data processing apparatus is transferred to the second data processing apparatus. The received data is decompressed by the data decompressor 1900 of the second data processing apparatus to be processed therein.

Figure 17:
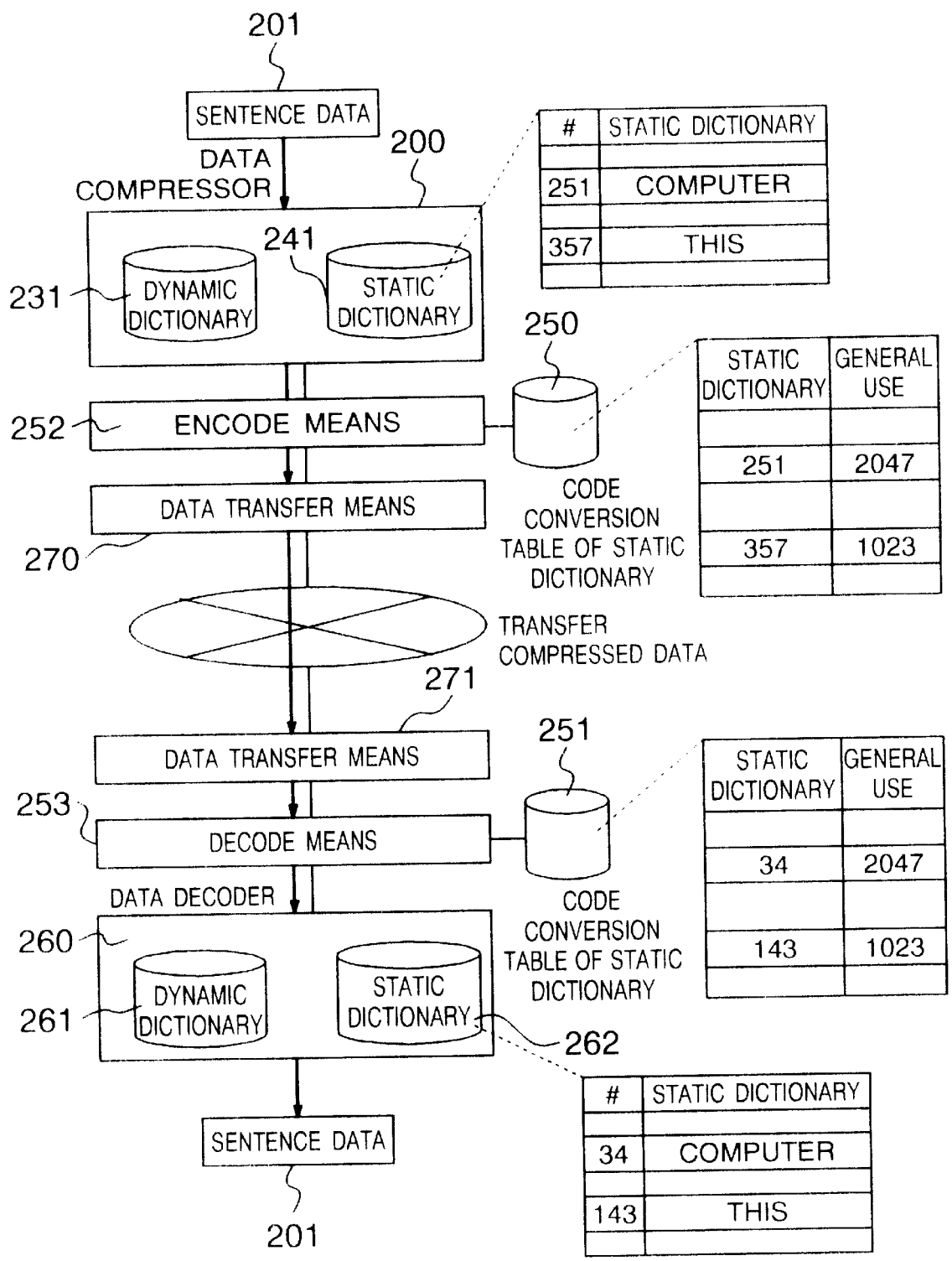
FIG. 17 is a diagram showing a configuration according to the present invention when the static dictionary cannot be shared in a distributed system.

FIG. 17 shows an embodiment of the present invention in which the static dictionary cannot be shared between the apparatuses in the distributed system. The data compressor 200 compresses data using the dynamic dictionary 231 or the static dictionary 241, whereas the data encoder 260 encodes data using the dynamic dictionary 260 or the static dictionary 261. The compressor 200 is substantially the same as the data compressor 200 shown in FIG. 2. Namely, the compressor 200 receives a sentence 201 and compresses the sentence 201 into compressed data. The decoder 260 accomplishes a data conversion reverse to that of the compressor 200. That is, the decoder 260 receives the compressed data and decodes the data into a sentence 201. The data compressor 200 is linked with encoder means 252 connected to data transfer means 270, which is coupled via a network with data transfer means 271. The transfer means 271 is linked with decoder means 253 connected to the data decoder 260. Moreover, the encoder means 252 includes a static dictionary code conversion table 250 and the decoder means 2253 includes a static dictionary code conversion table 251. Assume that sentence data 201 including words "computer" and "this" is inputted to the system and is compressed using the static dictionary 241. Words "computer" and "this" are transformed by the data compressor 200 respectively into indices "251" and "357" to be sent as a portion of compressed data to the encoder means 252. Receiving these data items, the encoder means 252 refers to the code conversion table 250 to convert the items into general indices "2047" and "1023". The resultant compressed data items including the general indices "2047" and "1023" are then sent via the data transfer means 270, network, and data transfer means 271 to the decoder means 253. On receiving the data items, the decoder means 253 refers to the code conversion table 251 to transform the general indices "2047" and "1023" respectively into indices "34" and "143" unique to the static dictionary 262. The compressed data including indices "34" and "143" is transmitted to the data decoder 260. The decoder 260 receives the compressed data and then refers to the static dictionary 262 to convert the indices "34" and "143" respectively into "computer" and "this" so as to produce the original sentence 201 including these words.

According to the embodiment, the encoder means 252 and decoder means 253 are respectively provided with the static dictionary code conversion tables 250 and 251 to transform indices of the static dictionaries 241 and 262 into general indices such that a standard code format is defined in the data transfer section. Thanks to the provision, the data compatibility is guaranteed between the data compressors and decoders having mutually different architecture.

In this connection, the encoder and decoder means 252 and 253 accomplish only the index code conversion in this embodiment. However, the present invention is not restricted by the embodiment. There may be adopted a process in which the data encoding and decoding operations may be combined with each other. As a result, there is provided a data compressing and encoding apparatus, leading to an advantage that the compressed data can be transmitted while guaranteeing the data security through the network.

According to the present invention, using the static dictionary in the data compression method based on the dynamic dictionary, the data compression ratio can be improved when compared with the data compression using only the dynamic dictionary. Particularly, when the static dictionary is employed in the data compression of the first portion of input data for which the data compression cannot be efficiently accomplished using the dynamic dictionary, the data compression ratio is much more improved. In addition, when a code discriminating the dynamic dictionary from the static dictionary is added to the index of compressed data, the dictionary switching process is facilitated in the decoding process. Furthermore, an item having the shortest code length is selected from the code of input bit string, index of the static dictionary, index of the dynamic dictionary such that the item is encoded into compressed data, which further improves the data compression ratio. Additionally, the pertinent input bit string is registered to the dynamic dictionary only when the index of the dynamic dictionary is smaller than that of the static dictionary for the input bit string. This minimizes the size of the dynamic dictionary. In particular, an index of a bit string matching an item in the static dictionary is outputted as compressed data and is not additionally registered to the dynamic dictionary. This reduces the dynamic dictionary size and the index length, leading to the improvement of the data compression ratio. Furthermore, in an operation to sequentially registering input bit strings to the dynamic dictionary, when the data volume of the dynamic dictionary reaches a predetermined data volume, the registration of another input string is inhibited and/or bit strings having a low utilization degree or frequency are deleted from the dynamic dictionary when necessary. This advantageously solve the problem of the overflow of bit strings from the dynamic dictionary.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

We claim:

1. A data compression method, comprising the steps of:

decomposing input data into input bit strings;

conducting a string retrieval through a first dictionary for the input bit string, the first dictionary including table data including bit strings associated respectively with indices each being shorter than the associated bit string;

registering the input bit string to the first dictionary according to a result of the retrieval;

converting the input bit string into a code of the input bit string or an index of the first dictionary corresponding to the input bit string, thereby outputting the attained code or index as compressed data;

conducting a string retrieval through a second dictionary for the input bit string, the second dictionary being configured by beforehand defining in a fixed manner bit strings as input candidates and indices thereof;

comparing the input bit string with a bit string in the second dictionary; and registering the input bit string to the first dictionary according to a result of the comparison.

2. A data compression apparatus in which input data is decomposed into input bit strings to conduct a string retrieval through a first dictionary for the input bit string, the first dictionary including table data including bit strings associated respectively with indices each being shorter than the associated bit string, the input bit string is registered to the first dictionary according to a result of the retrieval, and the input bit string into a code of the input bit string or an index of the first dictionary corresponding to the input bit string and the attained code or index is outputted as compressed data, comprising:

a second dictionary configured by beforehand defining in a fixed manner bit strings as input candidates and indices thereof;

means for generating the second dictionary;

means for referring to the contents of the second dictionary;

decision means for deciding whether or not a bit string is required to be registered to the first dictionary, thereby registering the input bit string to the first dictionary according to a result from the decision means.

3. A data compression method, comprising the steps of:

decomposing input data into input bit strings;

conducting a string retrieval through a first dictionary for the input bit string, the first dictionary including table data including bit strings associated respectively with indices each being shorter than the associated bit string;

registering the input bit string to the first dictionary according to a result of the retrieval;

converting the input bit string into a code of the input bit string or an index of the first dictionary corresponding to the input bit string, thereby outputting the attained code or index as compressed data; wherein the step of outputting the compressed data outputs either one of the codes including the code of the input bit string, the index of the first dictionary, and an index of a second dictionary configured by beforehand defining in a fixed manner bit strings as input candidates and indices thereof and a code specifying the first or second dictionary to be employed as a dictionary for a decoding operation.

4. A data compression method, comprising the steps of:

decomposing input data into input bit strings;

conducting a string retrieval through a first dictionary for the input bit string, the first dictionary including table data including bit strings associated respectively with indices each being shorter than the associated bit string;

registering the input bit string to the first dictionary according to a result of the retrieval;

converting the input bit string into a code of the input bit string or an index of the first dictionary corresponding to the input bit string, thereby outputting the attained code or index as compressed data;

storing a length of the code of the input bit string;

storing a length of an index corresponding to at least either one of the first dictionary of which a bit string matches the input bit string and the second dictionary configured by beforehand defining in a fixed manner bit strings as input candidates and indices thereof, wherein the step of outputting the compressed data outputs either one of the codes including the input bit string and the index, the code having a smaller length.

5. A data compression method according to claim 3, further including the step of outputting the index of the second dictionary as the compressed data when a bit string matching the input bit string is retrieved from the second dictionary.

6. A data compression method according to claim 3, further including the steps of:

memorizing the threshold number of bits for initiating the output of the index of the first dictionary;

calculating the number of bits processed up to a current point of time according to at least either one of the number of bits of the input bit string and the number of inputs; and outputting the index of the first dictionary as the compressed data when the number of processed bits exceeds the threshold number of bits.

7. A data compression method according to claim 1, further including the step of skipping the registration of the input bit string to the first dictionary when a bit string matching the input bit string is detected in the second dictionary.

8. A data compression method according to claim 1, wherein:

the step of comparing the input bit string with a bit string of the second dictionary memorizes a length of a first index matching with the input bit string in the second dictionary; and the step of registering the input bit string to the first dictionary calculates a length of a second index in association with the registration to the first dictionary and registers the second index to the first dictionary when the second index is shorter than the first index.

9. A data compressing apparatus according to claim 2, wherein the second dictionary includes character strings of at least one kind selected from at least one word or a portion thereof of a natural language such as English or Japanese, at least one reserved word or a portion thereof of a program language, and at least one instruction or a portion thereof of a machine language, the dictionary including at least one additional information selected from attribute information of the character string, an appearance probability thereof, and a relationship between the character strings.

10. A data compressing apparatus according to claim 9, wherein:

the second dictionary includes a character string of a natural language or a character string in an regular expression of a natural language;

the attribute information defines parts of speech, inflections of words, meanings of words; and the relationship between the character strings defines expressions or uses of words.

11. A data compression method according to claim 1, wherein:

the step of defining before data is inputted the bit strings as input candidates and indices thereof to generate the second dictionary defines together with the bit string and index at least one of additional information selected from attribute information of the bit string, appearance probability thereof, and a relationship between the bit strings;

the step of comparing the input bit string with a bit string of the second dictionary memorizes the additional information of the input bit string; and the step of registering the input bit to the first dictionary skips the registration of the input bit string according to the additional information of the second dictionary.

12. A data compression method according to claim 1, wherein:

the step of defining before data is inputted the bit strings as input candidates and indices thereof to generate the second dictionary defines together with the bit string and index at least one of additional information selected from attribute information of the bit string, appearance probability thereof, and a relationship between the bit strings;

the step of comparing the input bit string with a bit string of the second dictionary memorizes the additional information of the input bit string; and the step of registering the input bit to the first dictionary deletes at least one bit string according to the additional information of the second dictionary.

13. A data compressing apparatus according to claim 2, wherein the second dictionary includes at least one of additional information selected from attribute information of the bit string, appearance probability thereof, and a relationship between the bit strings, the apparatus further including:

at least one deleting means for deleting registered bit strings from the first dictionary according to the additional information of the second dictionary; and retrieving means for memorizing at least one selected from an upper-limit value of a usage size of the first dictionary and an upper-limit value of the number of registered bit strings and retrieving the input bit string from the firs dictionary, the deleting means executing detecting means for detecting an event that the accumulated number of input bit strings exceeds the upper-limit value and the deleting means for deleting at least one bit string from the first dictionary by referring to the additional information of the second dictionary.

14. A data compressing apparatus according to claim 2, further including an initializing screen for selecting for a program of the generating means to generate the second dictionary, a program thereof to register the input bit string to the first dictionary, or a program thereof to delete registered bit string from the first dictionary, thereby setting a condition for data compression.

15. A data compressing apparatus according to claim 2, wherein:

the first dictionary includes a maximum of $2^{10}$ to $2^{15}$ indices; and the second dictionary includes a maximum of $2^{12}$ to $2^{17}$ indices.

16. A data compression method, comprising the steps of:

decomposing input data into input bit strings;

generating a first dictionary with empty or predetermined fundamental bit strings;

retrieving the input bit string from the first dictionary;

registering the input bit string to the first dictionary;

encoding at least either one of the input bit string and a bit string of the first dictionary and outputting a result of the encoding as compressed data;

defining, before data is inputted, bit strings as input candidates and indices thereof and thereby generating a second dictionary; and confirming existence of a dictionary of which the contents are substantially equal to that of the second dictionary and outputting indices of the first and second dictionaries.

17. A data compressing apparatus for use in a distributed system including at least one data compressing apparatus and at least one data decoding apparatus, the data compressing apparatus compressing data using a first dictionary for registering thereto bit strings according to input data and a second dictionary beforehand defined, the data decoding apparatus decoding data using the first dictionary and a third dictionary which is totally or partly different from the second dictionary, the data compressing apparatus including:

encoder means for converting data into a general index independent of the second dictionary; and data transfer means for transmitting the general index therefrom, the data decoding means (apparatus) including:

data transfer means for receiving the general index; and decoding means for transforming the general index into an index of the third dictionary.

18. A data compression method of compressing and converting data including a first bit string into a second bit string, the second bit string smaller in length than the first bit string, comprising the steps of:

converting the data including a first bit string according to a predetermined rule into a second bit string, the second bit string having a smaller length than the first bit string;

converting the data into a third bit string smaller in length than the second bit string according to a table in which a bit string of each candidate input data beforehand fixedly corresponds to a bit string smaller in length than the bit string of the candidate input data;

comparing the second bit string with the third bit string;

deciding one of the bit strings smaller in length as a result of the comparison and outputting the bit string as a compressed and converted bit string.

19. A data compression method according to claim 18, further including the step of outputting, when the bit strings are substantially equal to each other as a result of the comparison, a predetermined one of the results of conversion as a compressed and converted bit string.

20. A data decompression method of decompressing compressed and converted data into original data in which the original data including a first bit string is converted into a second bit string, the second bit string smaller in length than the first bit string and the original data is converted into into a third bit string smaller in length than the second bit string according to a table in which a bit string of each candidate input data beforehand fixedly corresponds to a bit string smaller in length than the bit string of the candidate input data, thereby converting the original data into the compressed and converted data, comprising the steps of;

decompressing and converting a partial bit string of the bit string resultant from the compression and conversion according to the predetermined rule into a bit string of the original data according to a predetermined decompression rule; and decompressing and converting the compressed and concerted bit string thus converted according to the table into a bit string of the original input data according to a table in which each candidate compressed string fixedly corresponds to the bit string of the original input data.

21. A data decompression method according to claim 20, wherein:

the table for use in the compression and conversion and the table for use in the decompression and conversion are of a similar layout, the table being employed in the compression and conversion for attaining a short bit string in relation to the bit string of the candidate input data, the table being utilized in the decompression and conversion for obtaining the bit string of the original input data as the candidate in relation to the short bit string thus compressed.

22. A data decompression method according to claim 20, wherein the table for use in the compression and conversion and the table for use in the decompression and conversion are copies of an original table.

23. A data compressing apparatus, comprising:
- a first data compressing section for converting input data including a first bit string into a second bit string according to a predetermined rule, the second bit string smaller in length than the first bit string;
- a second data compressing section for converting the input data into a third bit string smaller in length than the second bit string according to a table in which a bit string of each candidate input data beforehand fixedly corresponds to a bit string smaller in length than the bit string of the candidate input data; and
- a compression control section for converting the input data into a bit string smaller in length than the bit string of the input data by the first and second data compressing sections.

24. A data compressing apparatus according to claim 23, wherein the compression control section compares the bit string converted by the first data compressing section with that converted by the second data compressing section and outputting one of the bits strings having a smaller length.

25. A data decompressing apparatus for decompressing compressed and converted data into original data compressed an converted by a first data compressing section and a second data compressing section, the first data compressing section converting input data a first bit string into a second bit string smaller in length than the first bit string, the second data compressing section converting the bit string of the input data into a third bit string smaller in length than the second bit string according to a table in which a bit string of each candidate input data beforehand fixedly corresponds to a bit string smaller in length than the bit string of the candidate input data, comprising:
- a first data decompressing section for decompressing and converting the compressed and converted bit string into the bit string of the original input data according to a predetermined rule;
- a second data decompressing section for decompressing the compressed and converted bit string into the bit string of the original input data according to a table in which the compressed and converted bit string as an input candidate beforehand fixedly corresponds to the bit string of the original input data; and
- an decompression control section for decompressing the compressed and converted bit string into the bit string of the original input data according to the first and second data compressing sections.

26. A data decompressing apparatus according to claim 25, wherein:
- the table of the second data compressing section and that of the second data decompressing section are similar in layout to each other;
- the second data compressing section obtains a short bit string from the bit string of the input data as an input candidate according to the table thereof; and
- the second data decompressing section attains according to the table thereof the bit string of the original input data as the input candidate from the short string compressed.

27. A data decompressing apparatus according to claim 25, wherein the table of the second data compressing section is substantially equal to that of the second data decompressing section.

28. A data processing apparatus, comprising:
- an input section for receiving data as an input thereto;
- a first data compressing section for converting input data from the input section including a first bit string into a second bit string according to a predetermined rule, the second bit string smaller in length than the first bit string;
- a second data compressing section for converting the input data into a third bit string smaller in length than the second bit string according to a table in which a bit string of each candidate input data beforehand fixedly corresponds to a bit string smaller in length than the bit string of the candidate input data;
- a compression control section for converting the input data into a bit string smaller in length than the bit string of the input data by the first and second data compressing sections; and
- an output section for outputting the bit string converted by the compression control section.

29. A data compressing apparatus according to claim 28, wherein the compression controller compares the bit string converted by the first data compressing section with that converted by the second data compressing section and outputs one of the bit strings having a smaller length.

30. A data processing apparatus receiving as an input thereto data compressed and converted by a first data compressing section and a second data compressing section, the first data compressing section converting input data a first bit string into a second bit string smaller in length than the first bit string, the second data compressing section converting the bit string of the input data into a third bit string smaller in length than the second bit string according to a table in which a bit string of each candidate input data beforehand fixedly corresponds to a bit string smaller in length than the bit string of the candidate input data, comprising:
- a first data decompressing section for decompressing and converting the compressed and converted bit string into the bit string of the original input data according to a predetermined rule;
- a second data decompressing section for decompressing the compressed and converted bit string into the bit string of the original input data according to a table in which the compressed and converted bit string as an input candidate beforehand fixedly corresponds to the bit string of the original input data; and
- an decompression control section for decompressing the compressed and converted bit string into the bit string of the original input data according to the first and second data compressing sections.

31. A data processing apparatus according to claim 30, wherein:
- the table of the second data compressing section and that of the second data decompressing section are similar in layout to each other;
- the second data compressing section obtains a short bit string from the bit string of the input data as an input candidate according to the table thereof; and
- the second data decompressing section attains according to the table thereof the bit string of the original input data as the input candidate from the short string compressed.

32. A data processing apparatus, comprising:
- an input section for receiving data as an input thereto;
- a process control section for for converting input data from the input section including a first bit string into a second bit string according to a predetermined rule, the second bit string smaller in length than the first bit string; converting the input data into a third bit string smaller in length than the second bit string according to a table in which a bit string of each candidate input data beforehand fixedly corresponds to a bit string smaller in length than the bit string of the candidate input data, comparing the converted bit strings with each other, and outputting therefrom one of the bits strings having a smaller length; and an output section for outputting the bit string converted by the compression control section.

33. A data processing apparatus, comprising:

an input section for receiving data as an input thereto;

a table in which a bit string of each candidate input data fixedly corresponds to a bit string smaller in length than the bit string of the candidate input data, a process control section for converting input data from the input section including a first bit string into a second bit string according to a predetermined rule, the second bit string smaller in length than the first bit string; converting the input data into a third bit string smaller in length than the second bit string according to a table in which a bit string of each candidate input data beforehand fixedly corresponds to a bit string smaller in length than the bit string of the candidate input data, comparing the converted bit strings with each other, and outputting therefrom one of the bits strings having a smaller length; and an output section for outputting the bit string converted by the compression control section.

34. A data processing apparatus, comprising:

a first table in which a bit string of each conversion candidate input data beforehand fixedly corresponds to a bit string smaller in length than the bit string of the candidate input data;

a data compressing section for converting data including a first bit string into a second bit string according to a predetermined rule, the second bit string smaller in length than the first bit string; converting the bit string of the data into a third bit string smaller in length than the second bit string according to the table, comparing the converted bit strings with each other, and outputting as a compressed and converted bit string therefrom one of the bits strings having a smaller length;

a second table in which each compressed and converted bit string beforehand fixedly corresponds to the bit string of the original data; and a data decompressing section for decompressing and converting the compressed and converted bit string into the bit string of the original data according to a predetermined rule and converting the compressed and converted bit string into the bit string of the original data according to the table.

35. A data decompressing apparatus according to claim 34, wherein:

the first and second tables are substantially equal to each other;

the data compressing section obtains a short bit string from the bit string of the input data as an input candidate according to the table thereof; and the data decompressing section attains according to the table thereof the bit string of the original input data as the input candidate from the short string compressed.

36. A network system in which a plurality of data processing apparatuses are connected to each other for data communication via network transmission paths, wherein:

first one selected from the plural data processing apparatuses includes:

a table in which a bit string of each candidate data beforehand fixedly corresponds to a bit string smaller in length than the bit string of the candidate input data;

a process control section for converting transfer data including a first bit string into a second bit string according to a predetermined rule, the second bit string smaller in length than the first bit string; converting the bit string of the transfer data into a third bit string smaller in length than the second bit string according to the table, comparing the converted bit strings with each other, and outputting as a compressed and converted bit string therefrom one of the bits strings having a smaller length;

a data transfer section for transmitting as transfer data to the network the compressed and converted bit string from the process control section; and second one arbitrarily selected from the plural data processing apparatus includes:

a data receiving section for receiving the compressed data from the data transfer section;

a table in which each compressed and converted bit string beforehand fixedly corresponds to the bit string of the original data; and a process control section for decompressing and converting the compressed and converted bit string received via the network into the bit string of the original data according to a predetermined rule and decompressing and converting the compressed and converted bit string into the bit string of the original data according to the table.

37. A network system according to claim 36, wherein:

the tables respectively of the first and second ones of the plural data processing apparatuses are similar in layout to each other;

the first one of the plural data processing apparatuses obtains a short bit string from the bit string of the input data as an input candidate according to the table thereof; and the second one of the plural data processing apparatuses attains according to the table thereof the bit string of the original input data as the input candidate from the short string compressed.

38. A network system according to claim 36, wherein the tables respectively of the first and second ones of the plural data processing apparatuses are copies of an original table.

39. A network system according to claim 36, wherein;

the plural data processing apparatuses includes at least one server; and other data processing apparatuses copy the tables from the server and stores the copied tables therein.

40. A network system according to claim 36, wherein the compressed and converted data to be transferred from the data transfer section to the network is expressed in a cryptographic system.

41. A network system in which a plurality of data processing apparatuses are connected to each other for data communication via network transmission paths, wherein:

each of at least two data processing apparatuses selected from the plural data processing apparatuses for data communication therebetween includes:

a table in which a bit string of each conversion candidate data beforehand fixedly corresponds to a bit string smaller in length than the bit string of the conversion candidate input data;

a first process control section for converting transfer data including a first bit string into a second bit string according to a predetermined rule, the second bit string smaller in length than the first bit string; converting the bit string of the transfer data into a third bit string smaller in length than the second bit string according to the table, compressing and converting the transfer data according to a combination of the converted bit strings, and outputting therefrom data thus converted;

a data transfer section for transmitting as transfer data to the network the compressed and converted bit string from the firs process control section; and a data receiving section for receiving via the network the compressed data from the communicating one of the data processing apparatuses; and a second process control section for decompressing and converting the compressed and converted bit string received by the data receiving section into the bit string of the original data according to a predetermined rule and decompressing and converting the compressed and converted bit string into the bit string of the original data according to the table.

42. A storage media storing therein a program for converting data including a first bit string into a second bit string, the second bit string smaller in length than the first bit string, wherein the program includes:

converting data including a first bit string into a second bit string according to a predetermined rule, the second bit string smaller in length than the first bit string and converting the bit string of the candidate input data into a third bit string smaller in length than the second bit string according to a table in which a bit string of each candidate input data beforehand fixedly corresponds to a bit string smaller in length than the bit string of the candidate input data;

comparing the converted bit strings with each other; and outputting as a compressed and converted bit string therefrom one of the bits strings having a smaller length as a result of the comparison.

43. A storage media according to claim 42, wherein a predetermined conversion result is outputted as the compressed and converted bit string when the converted bit strings are substantially equal to each other.

44. A storage media storing therein a program for converting data including a first bit string into a second bit string according to a predetermined rule, the second bit string smaller in length than the first bit string and converting the bit string of the candidate input data into a third bit string smaller in length than the second bit string according to a table in which a bit string of each candidate input data beforehand fixedly corresponds to a bit string smaller in length than the bit string of the candidate input data, and decompressing and converting the compressed and converted data into the original data according to a combination of the converted bit strings, the program comprising:

decompressing and converting a partial bit string of the compressed and converted bit string, the partial bit string compressed and converted according to the predetermined rule, thereby obtaining the bit string of the original data according to a predetermined decompression rule; and decompressing and converting a partial bit string of the compressed and converted bit string, the partial bit string compressed and converted according to the table, thereby obtaining the bit string of the original input data according to a table in which each compressed and converted bit string as candidate data beforehand fixedly corresponds to the bit string of the original input data.

* * * * *